(12) United States Patent
Kim

(10) Patent No.: US 7,750,988 B2
(45) Date of Patent: Jul. 6, 2010

(54) LIQUID CRYSTAL DISPLAY WITH LIGHT BLOCKING FILM TO ELIMINATE WATERFALL PHENOMENON

(75) Inventor: Dong-Gyu Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 364 days.

(21) Appl. No.: 11/733,961

(22) Filed: Apr. 11, 2007

(65) Prior Publication Data

US 2007/0242181 A1 Oct. 18, 2007

(30) Foreign Application Priority Data

Apr. 11, 2006 (KR) ...................... 10-2006-0032740

(51) Int. Cl.
G02F 1/136 (2006.01)
G02F 1/1343 (2006.01)

(52) U.S. Cl. ............................ 349/44; 349/42; 349/146

(58) Field of Classification Search .................. 349/44, 349/42, 146
See application file for complete search history.

(56) References Cited

U.S. PATENT DOCUMENTS

| | | | | |
|---|---|---|---|---|
| 5,521,728 A | * | 5/1996 | Kodate et al. .................. | 349/42 |
| 5,521,729 A | * | 5/1996 | Ukai et al. ..................... | 349/42 |
| 5,760,854 A | * | 6/1998 | Ono et al. ....................... | 349/38 |
| 6,091,467 A | * | 7/2000 | Kubo et al. .................... | 349/44 |
| 6,259,200 B1 | * | 7/2001 | Morita et al. ................ | 313/498 |
| 6,297,862 B1 | * | 10/2001 | Murade ........................ | 349/44 |
| 6,556,265 B1 | * | 4/2003 | Murade ....................... | 349/111 |
| 6,724,443 B1 | * | 4/2004 | Sano et al. ..................... | 349/39 |
| 6,975,367 B2 | * | 12/2005 | Lim ............................. | 349/43 |
| 2004/0169812 A1 | * | 9/2004 | Kim ............................ | 349/187 |

FOREIGN PATENT DOCUMENTS

JP 2004070331 A * 3/2004

* cited by examiner

*Primary Examiner*—Mike Qi
(74) *Attorney, Agent, or Firm*—Innovation Counsel LLP

(57) ABSTRACT

A liquid crystal display includes a substrate, a gate line over the substrate, a gate dielectric over the gate line, a first semiconductor feature over the gate dielectric, a first drain electrode and a first data line overlapping with the first semiconductor feature, a pixel electrode connected to the first drain electrode and overlapping with the first data line, and a light blocking film overlapping with the first semiconductor feature and the first data line.

24 Claims, 28 Drawing Sheets

The operation of (−) Pixel

The operation of (+) Pixel

LIQUID CRYSTAL DISPLAY WITH LIGHT BLOCKING FILM TO ELIMINATE WATERFALL PHENOMENON

CROSS-REFERENCE TO RELATED APPLICATION

This application claims priority to and the benefit of Korean Patent Application No. 10-2006-0032740 filed in the Korean Intellectual Property Office on Apr. 11, 2006, the entire contents of which are incorporated herein by reference.

BACKGROUND OF THE INVENTION (a) Field of the Invention

The present invention relates to a liquid crystal display.

(b) Description of the Related Art

A liquid crystal display (LCD) is one of the most widely used types of flat panel displays. A liquid crystal display includes two display panels with field generating electrodes, such as pixel electrodes and a common electrode. A liquid crystal layer is positioned between the two display panels. Voltages are applied to the field generating electrodes to generate electric fields in the liquid crystal layer and thus to control the orientation of the liquid crystal molecules in the liquid crystal layer, and hence the polarization of incident light, as needed to display a desired image.

The liquid crystal display includes switching elements connected to pixel electrodes and also includes signal lines such as data lines and gate lines for applying voltages to the pixel electrodes via the switching elements.

A popular LCD type is a vertical alignment (VA) mode LCD, in which the longitudinal axes of the liquid crystal molecules are perpendicular to the upper and lower display panels when no electric field is applied. In this LCD type, a high contrast ratio and a large reference viewing angle can be easily implemented. The reference viewing angle can be defined as a viewing angle at which the contrast ratio is 1:10, or a viewing angle at which luminance inversion occurs at some predefined luminance level.

A very-large aperture ratio structure having wide pixel electrodes in order to improve the aperture ratio of a liquid crystal display has been suggested. In such a structure, the pixel electrodes and the data lines overlap with each other, increasing the parasitic capacitance. If there is a semiconductor layer present under the data lines, parasitic capacitance is also obtained between the semiconductor layer and the pixel electrodes, thereby affecting pixel electrode voltages.

It is desirable to improve the aperture ratio of a liquid crystal display and reduce the effect of the semiconductor layer on pixel electrode voltages.

SUMMARY OF THE INVENTION

Some embodiments of the present invention include a liquid crystal display comprising: a substrate; a first gate line over the substrate; a gate dielectric over the first gate line; a first semiconductor feature over the gate dielectric; a first drain electrode and a first data line overlapping with the first semiconductor feature; a pixel electrode connected to the first drain electrode and overlapping with the first data line; and a light blocking film overlapping with the first semiconductor feature and the first data line.

In some embodiments, the light blocking film is made of the same material as the first gate line.

In some embodiments, the first semiconductor feature is wider than the first data line.

In some embodiments, the light blocking film includes portions of different widths.

In some embodiments, the pixel electrode comprises first and second subpixel electrodes that are separated from each other.

In some embodiments, the first and second subpixel electrodes comprise at least two parallelogrammic electrode positioners extending in respective two different directions.

In some embodiments, the first subpixel electrode comprises one right-slope parallelogrammic electrode positioner and one left-slope parallelogrammic electrode positioner; and the second subpixel electrode comprises three right-slope parallelogrammic electrode positioners and three left-slope parallelogrammic electrode positioners.

In some embodiments, the second subpixel electrode has a larger area than the first subpixel electrode.

In some embodiments, the first subpixel electrode is at a different voltage from the second subpixel electrode.

In some embodiments, the liquid crystal further comprises: a second gate line over the substrate; a first thin film transistor connected to the first subpixel electrode; and a second thin film transistor connected to the second subpixel electrode, wherein the first gate line is connected to the first thin film transistor, and wherein the second gate is line connected to the second thin film transistor.

In some embodiments, the first and second thin film transistors are turned on in response to signals from the first and second gate lines, respectively, to transmit signals from the first data line.

In some embodiments, the liquid crystal display further comprises an organic layer between the data line and the pixel electrode and between the drain electrode and the pixel electrode.

In some embodiments, the light blocking film is wider than the first semiconductor feature.

In some embodiments, the liquid crystal display further comprises: a second data line neighboring the first data line and overlapping with the pixel electrode; and a second semiconductor feature overlapping with the second data line, wherein an overlap area of the pixel electrode with the first semiconductor feature is substantially equal to an overlap area of the pixel electrode with the second semiconductor feature.

In some embodiments, the first data line and the second data line have opposite voltage polarities.

Some embodiments of the present invention include a liquid crystal display comprising: a substrate; a gate line on the substrate; a gate dielectric layer on the gate line; a first semiconductor feature on the gate dielectric layer; a first drain electrode and a first data line overlapping with the first semiconductor feature; a pixel electrode connected to the first drain electrode and overlapping with the first data line, the pixel electrode comprising first and second subpixel electrodes; and a light blocking film on at least one of a first region in which the first subpixel electrode overlaps with the first data line and a second region in which the second subpixel electrode overlaps with the first data line.

In some embodiments, the light blocking film in the first region is wider than the light blocking film in the second region.

In some embodiments, the light blocking film in the second region is substantially as wide as the first semiconductor feature.

In some embodiments, the light blocking film in the first region is wider than the first semiconductor feature.

In some embodiments, one edge of the light blocking film in the first region protrudes by more than 3 μm beyond the first semiconductor feature.

In some embodiments, the liquid crystal display further comprises: a second data line neighboring the first data line and overlapping with the pixel electrode; and a second semiconductor feature overlapping with the second data line, wherein an overlap area of the pixel electrode with the first semiconductor feature is equal to an overlap area of the pixel electrode with the second semiconductor feature.

In some embodiments, the first data line and the second data line have opposite voltage polarities.

Some embodiments provide a liquid crystal display comprising: pixel electrodes; one or more first electrodes; liquid crystal between the pixel electrodes and the first electrodes, the liquid crystal being in a path of light from a backlighting unit; data lines for carrying signals to the pixel electrodes; transistors connected between the data lines and the pixel electrodes; a semiconductor layer comprising channel regions for the transistors and also comprising first features whose conductivity depends on whether or not they are exposed to the light from the backlighting unit, the features overlapping with the pixel electrodes; and one or more light blocking features for shielding the first features from said light.

Some embodiments provide a method for manufacturing a liquid crystal display, the method comprising: providing pixel electrodes; providing one or more first electrodes; providing liquid crystal between the pixel electrodes and the first electrodes, the liquid crystal being in a path of light from a backlighting unit; providing data lines for carrying signals to the pixel electrodes; providing transistors connected between the data lines and the pixel electrodes; providing a semiconductor layer comprising channel regions for the transistors and also comprising first features whose conductivity depends on whether or not they are exposed to the light from the backlighting unit, the features overlapping with the pixel electrodes; and providing one or more light blocking features for shielding the first features from said light.

DESCRIPTION OF SOME EMBODIMENTS

Figure 1:
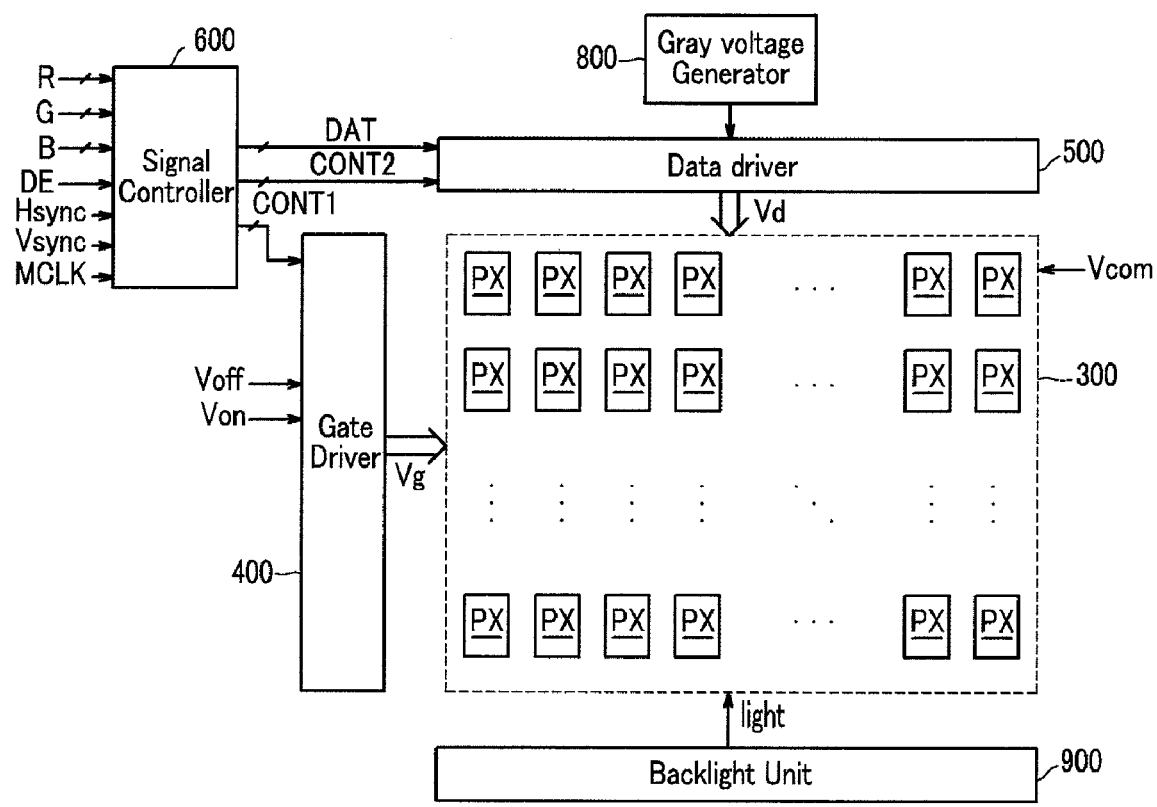
FIG. 1 is a block diagram of a liquid crystal display according to an exemplary embodiment of the present invention.

Some embodiments of the present invention are described below with reference to the accompanying drawings. As those skilled in the art will realize, these embodiments can be modified in may ways without departing from the spirit or scope of the present invention.

In the drawings, the thickness of layers, films, panels, regions, etc., and other dimensions can be exaggerated for clarity and is not necessarily to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
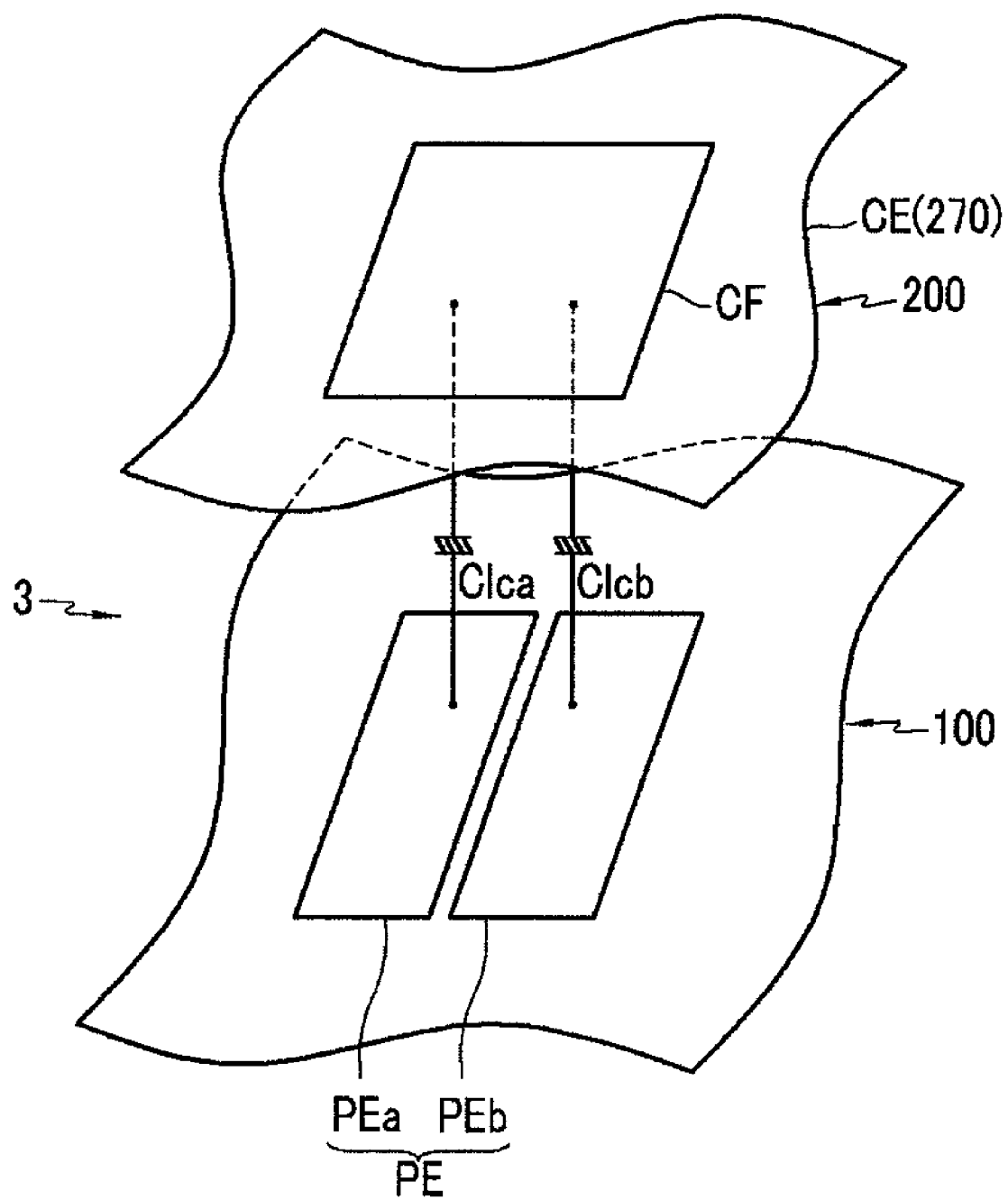
FIG. 2 is a circuit diagram for two subpixels of the liquid crystal display according to an exemplary embodiment of the present invention.

FIG. 1 is a block diagram of a liquid crystal display according to an exemplary embodiment of the present invention, and FIG. 2 is a circuit diagram showing two subpixels of the liquid crystal display according to an exemplary embodiment of the present invention.

The liquid crystal display of FIG. 1 includes a liquid crystal panel assembly 300. A gate driver 400 and a data driver 500 are connected to the liquid crystal panel assembly 300. A gray voltage generator 800 is connected to the data driver 500. A signal controller 600 controls the liquid crystal panel assembly 300, the gate driver 400, the data driver 500, and the gray voltage generator 800.

The liquid crystal panel assembly 300 includes a plurality of signal lines and a plurality of pixels PX connected to the signal lines and arranged basically in a matrix. In the structure illustrated in FIG. 2, the liquid crystal panel assembly 300 includes lower and upper panels 100 and 200 that face each other and a liquid crystal layer 3 interposed therebetween.

The signal lines include a plurality of gate lines (not shown) for transmitting gate signals (also referred to as "scanning signals") and a plurality of data lines (not shown) for transmitting data signals. The gate lines extend basically in a row direction to run parallel or almost parallel to each other, while the data lines extend basically in a column direction to run parallel or almost parallel to each other.

Each pixel PX includes a pair of subpixels, and the pair of subpixels includes liquid crystal capacitors Clca and Clcb. At least one of the two subpixels includes a switching element (not shown) connected to a gate line, a data line, and the respective liquid crystal capacitor Clca or Clcb.

One plate of each of the liquid crystal capacitors Clca and Clcb is provided by respective subpixel electrode PEa or PEb located in the lower panel 100, and the other plate is provided by a common electrode CE (also shown at 270) of the upper panel 200. The capacitor dielectric is provided by the liquid crystal layer 3, located between the subpixel electrodes PEa and PEb on the one hand and the common electrode CE on the other hand. The subpixel electrodes PEa and PEb are separated from each other and together form a pixel electrode PE of the pixel PX. The common electrode CE extends over the entire surface of the upper panel 200, and receives a common voltage Vcom. The liquid crystal layer 3 has negative dielectric anisotropy, and the longitudinal axes of the liquid crystal molecules of the liquid crystal layer 3 may be perpendicular to the two display panels when no electric field is applied.

To provide polychromatic display, each pixel PX displays only a respective one of three primary colors (spatial division) or displays each primary color in sequence (temporal division), so that a desired color is generated by the spatial or temporal sum of the primary colors. The three primary colors may be red, green, and blue. FIG. 2 illustrates an example of the spatial division in which each pixel PX includes a color filter CF that represents one of the primary colors. The color filters CF can be part of the upper panel 200 as in FIG. 2, or can be formed in the lower panel 100 over or under the subpixel electrodes PEa and PEb.

Polarizers (not shown) are provided on the outer surfaces of the display panels 100 and 200, and the polarization axes of the polarizers may be perpendicular to each other. In a reflective liquid crystal display, one of the two polarizers may be omitted. In case of crossed polarizers, incident light is blocked if no electric field is applied to the liquid crystal layer 3.

Referring to FIG. 1 again, the gray voltage generator 800 generates a plurality of gray voltages (or reference gray voltages) as needed for possible transmittance levels of the pixels PX.

The gate driver 400 is connected to the gate lines of the liquid crystal panel assembly 300 to apply gate signals Vg to the gate lines. Each gate signal Vg can have two possible voltage levels, one of which is a gate-on voltage Von and the other one of which is a gate-off voltage Voff.

The data driver 500 is connected to the data lines of the liquid crystal panel assembly 300 to select gray voltages generated by the gray voltage generator 800 and to provide the selected gray voltages as data signals to the data lines.

In some embodiments, the gray voltage generator 800 generates only a subset of possible gray voltages that may be needed for the data lines, and the data driver 500 divides the reference gray voltages generated by the gray voltage generator 800 as needed to provide the entire set of gray voltages that may be needed for the data signals. To display a frame, the data driver 500 selects the gray voltages from the entire set as needed to provide the data signals required for the frame.

The signal controller 600 controls the gate driver 400, the data driver 500, and other circuitry.

The driving circuits 400, 500, 600, and 800 may be mounted directly on the liquid crystal panel assembly 300 as one or more integrated circuit (IC) chips, or may be mounted on a flexible printed circuit film (not shown) attached to the liquid crystal panel assembly 300 as a tape carrier package (TCP), or may be mounted on a separate printed circuit board (PCB) (not shown). Alternatively, the driving devices 400, 500, 600, and 800 may be integrated together with the liquid crystal panel assembly 300.

The driving devices 400, 500, 600, and 800 may be integrated into a single chip or may be implemented as a circuit with one or more chips and discrete devices.

One exemplary embodiment of the liquid crystal panel assembly of FIGS. 1 and 2 will now be described with reference to FIGS. 3 to 10C.

Figure 3:
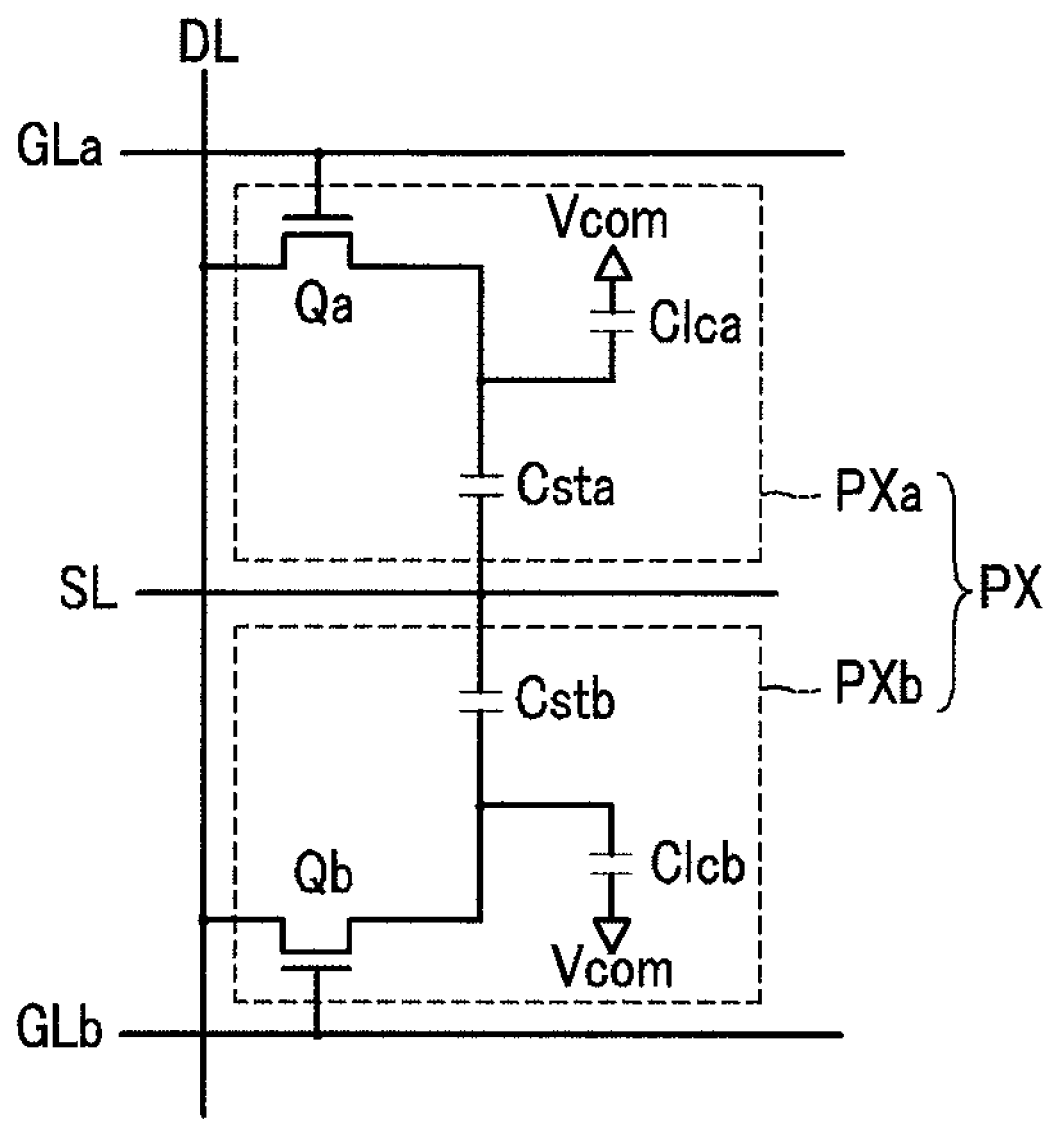
FIG. 3 is a circuit for one pixel of a liquid crystal panel assembly according to an exemplary embodiment of the present invention.

FIG. 3 is a circuit diagram of one pixel of the liquid crystal panel assembly according to this exemplary embodiment. The liquid crystal panel assembly according to this embodiment includes signal lines including a plurality of pairs of gate lines GLa and GLb (only one pair shown), a plurality of data lines DL (only one shown), a plurality of storage electrode lines SL (only one shown). The pixels PX (only one shown) are connected to the signal lines.

Each pixel PX includes a pair of subpixels PXa and PXb. Each subpixel PXa, PXb includes a respective switching element Qa or Qb connected to the respective gate line GLa or GLb and to the data line DL, and includes a respective liquid crystal capacitor Clca or Clcb connected to the respective switching element Qa or Qb. Each subpixel PXa or PXb includes a respective storage capacitor Csta or Cstb connected to the respective switching element Qa or Qb and to the storage electrode line SL.

Each switching element Qa, Qb is a three-terminal element formed on the lower panel 100, such as a thin film transistor. Each switching element Qa, Qb has a control terminal connected to the respective gate line GLa or GLb, an input terminal connected to the data line DL, and an output terminal connected to the respective liquid crystal capacitor Clca or Clcb and the respective storage capacitor Csta or Cstb.

The storage electrode line SL and the pixel electrode PE provided on the lower panel 100 overlap with each other and with an insulator interposed therebetween to form the storage capacitors Csta, Cstb that supplement the liquid crystal capacitors Clca, Clcb. A predetermined voltage such as the common voltage Vcom is applied to the storage electrode line SL. However, the subpixel electrode PE may overlap with an adjacent gate line instead, e.g. with the previous gate line, and with the insulator interposed therebetween, to obtain the storage capacitors Csta, Cstb.

Since the liquid crystal capacitors Clca, Clcb have been described above, their detailed description will not be repeated.

In the liquid crystal display including such a liquid crystal panel assembly, the signal controller 600 receives input image signals R, C; and B for each pixel PX. (In case of the spacial division, only one of the primary colors R, C; B is provided for each pixel.) The image signal controller 600 converts the input image signals for each pixel into output image signals DAT for the corresponding two subpixels PXa and PXb, and transmits the image signals DAT to the data driver 500.

The gray voltage generator 800 generates all possible gray voltage values for each subpixels PXa, PXb and provides the voltage values to the data driver 500. The set of all possible voltage values for the subpixels PXa can be the same or different from the set of all possible voltage values for the subpixels PXb. The subpixels PXa receive the data line voltages when the gate lines GLa turn on the transistors Qa. The subpixels PXb receive the dataline voltages when the gate lines GLb turn on the transistors Qb. The transistors Qa, Qb may be on at the same time (if the subpixels PXa, PXb of each pixel PX are at the same voltage) or at different times (regardless of whether or not the subpixels PXa, PXb are at the same voltage). The gray voltage generator 800 alternately provides the set of gray voltages for the subpixels PXa, then for the subpixels PXb, then for the subpixels PXa again, and so on. Alternatively, the gray voltage generator 800 provides both sets of gray voltages at the same time. The data driver 500 selects the voltages corresponding to the signals DAT and applies the selected voltages to the data lines. Thus, the data driver 500 selects the voltages for the subpixels PXa and applies them to the respective data lines, then selects the voltages for the subpixels PXb and applies them to the respective data lines, and so on. Alternatively, if the transistors Qa, Qb are on at the same time, the data driver 500 selects the voltages for the subpixels PXa, PXb and provides them at the same time to the data lines. In this process, steps can be taken to conform the synthesized gamma curves for front and side views to a reference. For example, it may be desirable for the synthesized gamma curve for the front view to coincide with a suitable reference gamma curve for the front view, and/or it may be desirable for the synthesized gamma curve for a side view to be as close as possible to the reference gamma curve for the front view. This can be achieved via a suitable correction of the image signals DAT and/or via a suitable procedure for generating the gray voltage sets.

The example of the liquid crystal panel assembly shown in FIG. 3 will now be described in more detail with reference to FIGS. 4 to 8.

Figure 4:
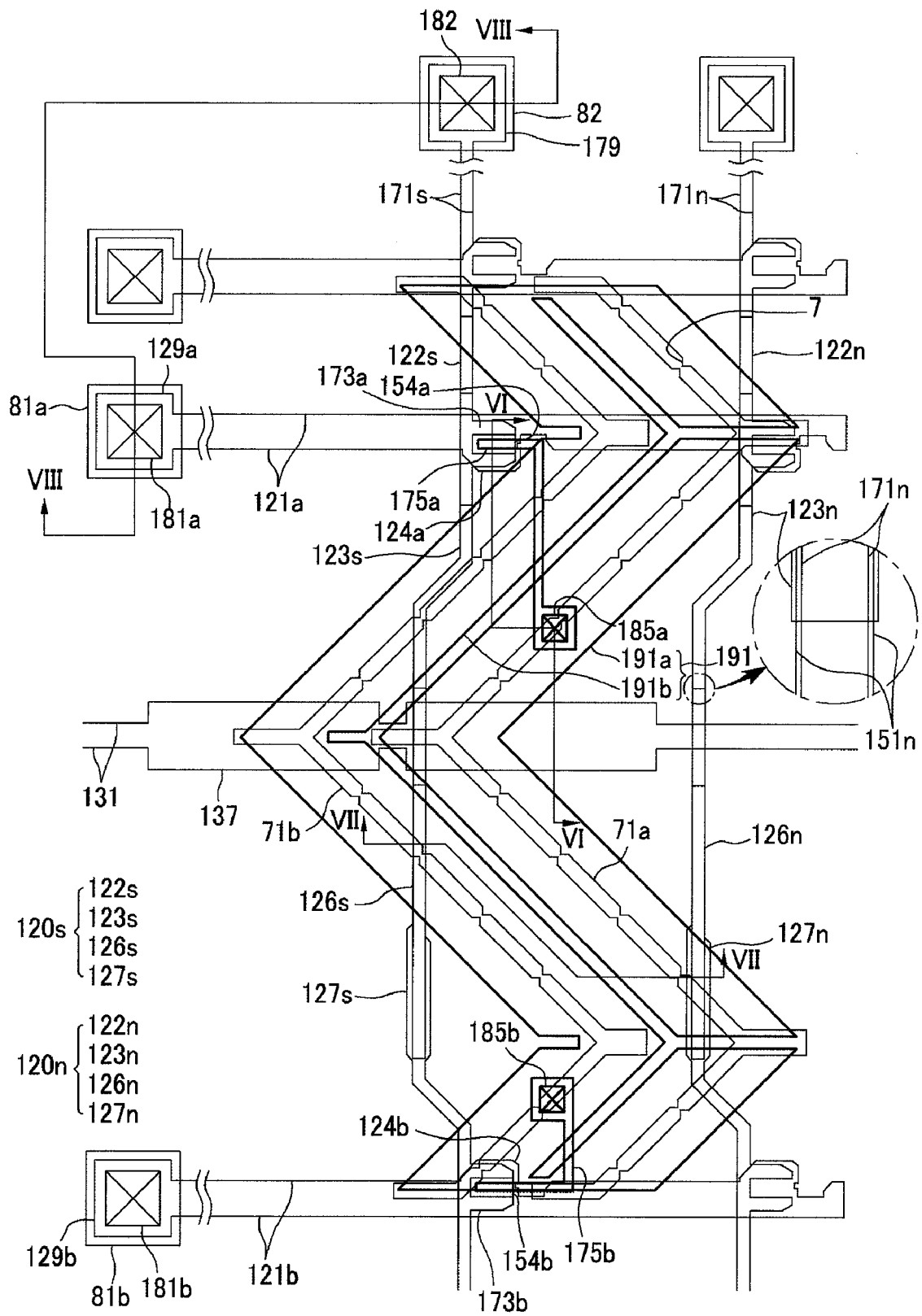
FIG. 4 is a layout view of a liquid crystal panel assembly according to an exemplary embodiment of the present invention.
Figure 5:
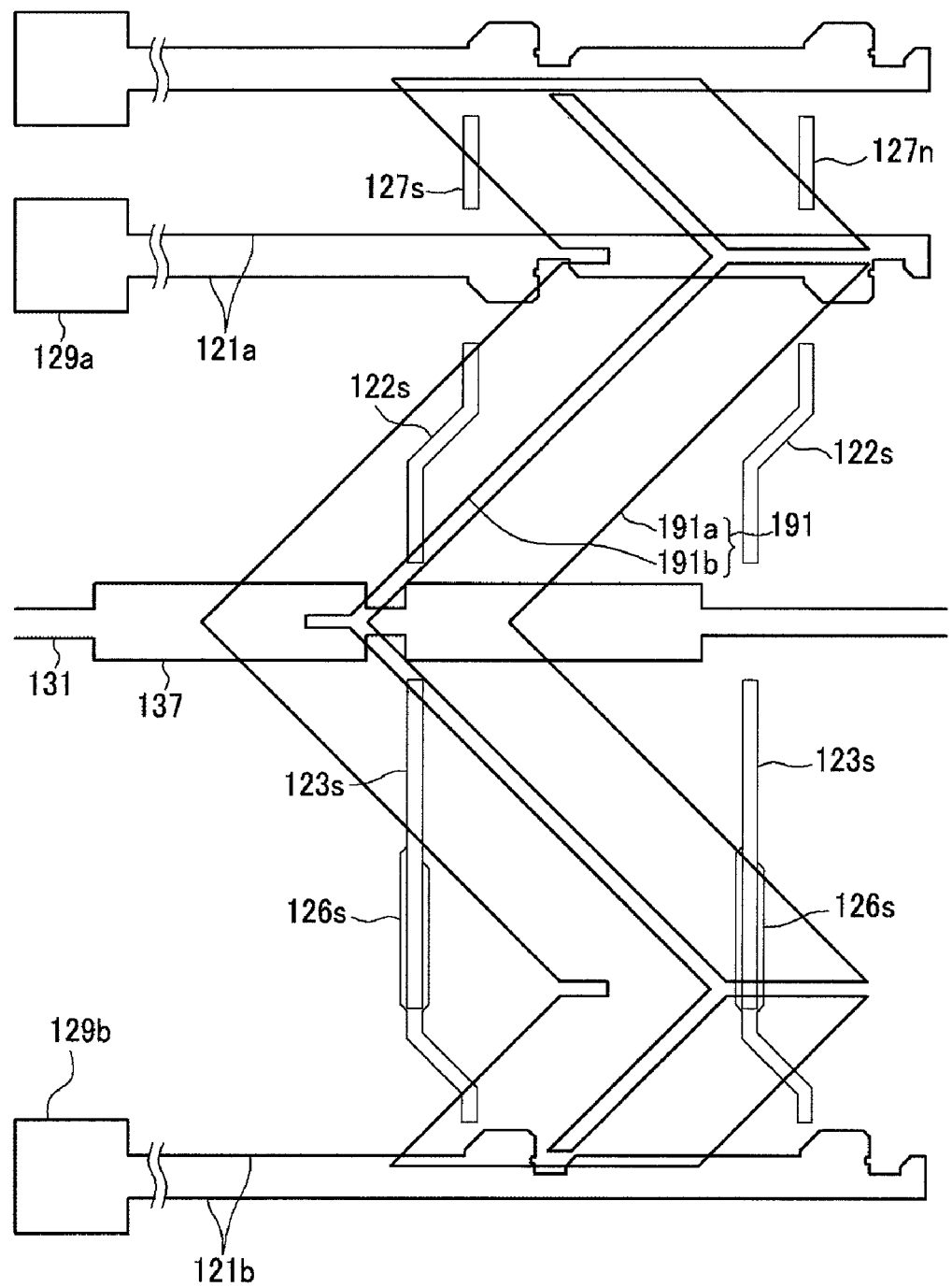
FIG. 5 is a layout view illustrating gate conductors and pixel electrodes of the liquid crystal panel assembly shown in FIG. 4.

FIG. 4 is a layout view of the liquid crystal panel assembly according to this example, FIG. 5 is a layout view of a part of the liquid crystal panel assembly shown in FIG. 4, and FIG. 6, FIG. 7, and FIG. 8 are cross-sectional views of the liquid crystal panel assembly taken along the lines VI-VI, VII-VII, and VIII-VIII of FIG. 4.

Referring to FIG. 4, FIG. 5, FIG. 6, FIG. 7, and FIG. 8, the liquid crystal panel assembly according to the present exemplary embodiment includes a lower panel 100 and an upper panel 200 that face each other, and a liquid crystal layer 3 interposed therebetween.

At first, the lower panel 100 will be described.

A plurality of gate conductors including a plurality of pairs of first and second gate lines 121*a* and 121*b* (only one pair shown), a plurality of storage electrode lines 131 (only one shown), and a plurality of light blocking films 120*s* and 120*n* are formed on an insulation substrate 110 made of transparent glass or plastic. Gate lines 121*a*, 121*b* correspond to gate lines GLa, GLb in FIG. 3, and storage electrode lines 131 correspond to storage electrode line SL.

The first and second gate lines 121*a* and 121*b* transmit gate signals and extend basically in a horizontal direction in the top view of FIGS. 4 and 5. Gate line 121*a* is positioned above gate line 121*b* in this view.

The first gate line 121*a* includes a plurality of first gate electrodes 124*a* (only one shown) protruding downward (in the view of FIGS. 4, 5), and a widened end 129*a* for connection with another layer and/or with the gate driver 400. The second gate line 121*b* includes a plurality of second gate electrodes 124*b* (only one shown) protruding upward, and a widened end 129*b* for connection with another layer and/or with the gate driver 400. If the gate driver 400 is integrated with the substrate 110, the gate driver 400 may be directly connected to the first and second gate lines 121*a* and 121*b*.

The storage electrode line 131 receives a predetermined voltage such as a common voltage Vcom, and extends basically in a horizontal direction. The storage electrode line 131 is placed between the first gate line 121*a* and the second gate line 121*b*. Each storage electrode line 131 includes a plurality of storage electrodes 137 extending upward and downward. Other shapes and positions are also possible for storage electrode lines 131 and their storage electrodes 137.

The light blocking films 120*s* and 120*n* extend basically in a vertical direction and include a plurality of regions 122*s*, 123*s*, 126*s*, 127*s*, 122*n*, 123*n*, 126*n*, and 127*n* that are separated from one another. The light blocking films are divided into multiple regions in order not to short the first and second gate lines 121*a* and 121*b* and the storage electrode line 131 to each other. The first and second gate lines 121*a* and 121*b* and the storage electrode line 131 extend basically in a horizontal direction.

The gate conductors 120*s*, 120*n*, 121*a*, 121*b*, and 131 may be made of aluminum (Al), silver (Ag), copper, molybdenum (Mo), or an alloy of one or more of these metals. The gate conductors 120*s*, 120*n*, 121*a*, 121*b*, 131 may also be made of chromium (Cr), tantalum (Ta), or titanium (Ti). The gate conductors may have a multi-layer structure including at least two conductive layers (not shown) with different physical properties. One of the two conductive layers may be made of a low-resistivity metal to reduce a voltage drop along the conductors. Suitable metals include aluminum, silver, copper, and their alloys. The other conductive layer may be made of a material having suitable physical, chemical, and electrical properties to make good electrical contact to certain other materials, particularly to indium tin oxide (ITO) and indium zinc oxide (IZO). Materials suitable for the other conductive layer include molybdenum and its alloys, chromium, tantalum, and titanium. For example, the gate conductors 120*s*, 120*n*, 121*a*, 121*b*, 131 can be made of a two-layer structure including chromium for the lower layer and aluminum or its alloy for the upper layer, or aluminum or its alloy for the lower layer and molybdenum or its alloy for the upper layer. The gate conductors 121*s*, 121*n*, 121*a*, 121*b*, and 131 may also be made of other metal and non-metal conductive materials.

When viewed in a vertical cross section, the sidewalls of the gate conductors 120*s*, 120*n*, 121*a*, 121*b*, and 131 are inclined relative to the surface of the substrate 110 at a suitable angle, preferably about 30 to 80 degrees.

A gate dielectric layer 140 made of silicon nitride (SiNx) or silicon oxide (SiOx) is formed on the gate conductors 120*s*, 120*n*, 121*a*, 121*b*, and 131.

A plurality of semiconductor strips 151*s* and 151*n* (FIG. 7) made of hydrogenated amorphous silicon (a-Si) or polysilicon are formed on the gate dielectric layer 140. The semiconductor strips 151*s* and 151*n* extend basically in a vertical direction in the view of FIGS. 4 and 5 and include a plurality of first and second projections 154*a* and 154*b* protruding toward the first and second gate electrodes 124*a* and 124*b*.

A plurality of ohmic contact strips 161*s* and 161*n*, first ohmic contact islands 165*a* and second ohmic contact islands (not shown) are formed on the semiconductor strips 151*s* and 151*n*. The ohmic contacts 161*s*, 161*n*, the first ohmic contact islands 165*a*, and the second ohmic contact islands may be made of silicide or n+ hydrogenated amorphous silicon heavily doped with an n-type impurity such as phosphorus. The ohmic contact strips 161*s* and 161*n* have a plurality of first projections 163*a* and second projections (not shown). The first projections 163*a*, the second projections, the first ohmic contact islands 165*a*, and the second ohmic contact islands are located in pairs on the first and second projections 154a and 154b of the semiconductor strips 151.

When viewed in a vertical cross section, the sidewalls of the semiconductor features 151s, 151n, 154a, and 154b and the ohmic contacts 161s, 161n, 163a, and 165a are inclined relative to the surface of the substrate 110 at about 30 to 80 degrees.

A plurality of data conductors including a plurality of data lines 171s and 171n (each of which corresponds to the data line DL in FIG. 3) and a plurality of pairs of first and second drain electrodes 175a and 175b are formed on the ohmic contacts 161s, 161n, 163a, and 165a and the gate dielectric layer 140.

The data lines 171 transmit data signals and extend basically in a vertical direction in the view of FIGS. 4, 5 to overlap the gate lines 121a and 121b and the storage electrode lines 131. Each data line 171 is not a straight line but has at least two bends at each pixel.

Each data line 171 has a plurality of pairs of first and second source electrodes 173a and 173b (only one pair shown) extending toward the first and second gate electrodes 124a and 124b. Each data line 171 has a widened end 179 for connection to another layer and/or the data driver 500. If the data driver 500 is integrated with the substrate 110, the data driver 500 may be directly connected to the data lines 171.

The first and second drain electrodes 175a and 175b are separated from each other and the data lines 171.

The first and second drain electrodes 175a and 175b face the respective first and second source electrodes 173a and 173b, with the respective first and second gate electrodes 124a and 124b interposed therebetween when viewed in the view of FIGS. 4, 5. The rod-shaped ends of the first and second drain electrodes 175a and 175b are partially surrounded by the respective first and second source electrodes 173a and 173b.

The first and second thin film transistors (TFTs) Qa and Qb are formed by the respective first and second gate electrodes 124a and 124b, the respective first and second source electrodes 173a and 173b, and the respective first and second drain electrodes 175a and 175b, together with the respective first and second semiconductor projections 154a and 154b. The channels of the first and second thin film transistors Qa and Qb are formed in the first and second semiconductor projections 154a and 154b between the first and second source electrodes 173a and 173b and the first and second drain electrodes 175a and 175b, respectively.

The data conductors 171, 175a, 175b are preferably made using a refractory metal such as molybdenum, chromium, tantalum, titanium, or alloys thereof, and have a multi-layer structure having a refractory metal layer (not shown) and a low-resistivity conductive layer (not shown). Suitable examples include a two-layer structure with a lower layer of chromium, molybdenum, or molybdenum alloy and an upper layer of aluminum or its alloy, or a three-layer structure with a lower layer of molybdenum or its alloy, a middle layer of aluminum or its alloy, and an upper layer of molybdenum or its alloy. The data conductors 171, 175a, and 175 may also be made of other metal and non-metal conductive materials.

When viewed in a vertical cross section, the sidewalls of the data conductors 171, 175a, and 175b are inclined relative to the surface of the substrate 110 at a suitable angle, preferably about 30 to 80 degrees.

The ohmic contacts 161s, 161n, the first projections 163a and the second projections, the first ohmic contacts 165a and the second ohmic contacts are restricted to regions between the semiconductor projections 154a and 154b on the one hand, and the data conductors 171, 175a, and 175b on the other hand, and are used to reduce the contact resistance between the semiconductor projections and the data conductors. The semiconductor projections 154a and 154b have exposed regions not covered with the data conductors 171, 175a, and 175b. The exposed regions include the regions located, in the view of FIGS. 4 and 5, between the source electrodes 173a, 173b on the one hand and the respective drain electrodes 175a, 175b on the other hand.

The semiconductor strips 151s and 151n, the data conductors 171, 175a, and 175b, and the ohmic contacts and islands 161s, 161n, 163a, 165a, and the second projections and ohmic islands have substantially the same planar shape. However, the width D1 of the semiconductor strips 151s and 151n is greater than the width D2 of the data lines 171. Therefore, in the cross-sectional view, the semiconductor strips 151s and 151n have edge portions 151e extending beyond the data lines 171.

A passivation layer 180 is formed on the data conductors 171, 175a, and 175b, and the exposed regions of the semiconductor projections 154a and 154b. The passivation layer 180 may be made of an inorganic or organic insulator, and may have a planar top surface. It is preferable to use a photosensitive organic insulator with a dielectric constant less than 4.0.

The passivation layer 180 may have a two-layer structure including a lower inorganic layer and an upper organic layer to protect the exposed regions of the semiconductor projections 154a and 154b and to combine good insulating characteristics of the two layers.

Contact holes 182, 185a, and 185b are formed in the passivation layer 180 to expose the ends 179 of the data lines 171 and the ends of the drain electrodes 175a and 175b, respectively. Also, contact holes 181a and 181b are formed in the passivation layer 180 and the gate dielectric layer 140 to expose the ends 129a and 129b of the respective gate lines 121a and 121b.

A plurality of pixel electrodes 191 and a plurality of contact liners 81a, 81b, and 82 are formed over the passivation layer 180. They may be made of a transparent conductive material such as ITO or IZO or a reflective metal such as Al, Ag, Cr, or an alloy of Al, Ag, or Cr.

Each pixel electrode 191 includes a pair of first and second subpixel electrodes 191a and 191b that are separated from each other. The first subpixel electrode 191a is connected to the respective first drain electrode 175a through the contact hole 85a, and the second subpixel electrode 191b is connected to the respective second drain electrode 175b through the contact hole 185b.

Each pixel electrode 191 overlaps with two data lines 171, with the passivation layer 180 interposed therebetween. Each data line 171 overlaps with two adjacent pixel electrodes 191 in each row. The data lines 171 are not straight but are bent in order for each data line 171 to overlap not only with the respective pixel electrode 191 connected to the data line via thin film transistors Qa, Qb but also with the pixel electrode 191 in the next column to the left (except possibly the data line connected to the pixel electrodes in the leftmost column). For example, the data line 171s of FIG. 4 overlaps not only with the pixel electrode 191 of FIG. 4 but also with the next pixel electrode (not shown) to the left. The data line 171n overlaps with, but is not connected to, the pixel electrode 191 of FIG. 4 and also overlaps with, and is connected to, the next pixel electrode to the right (not shown).

The structure of a pixel electrode of the liquid crystal panel assembly will now be described in detail with reference to FIG. 9, FIG. 10A, FIG. 10B, and FIG. 10C.

Figure 9:
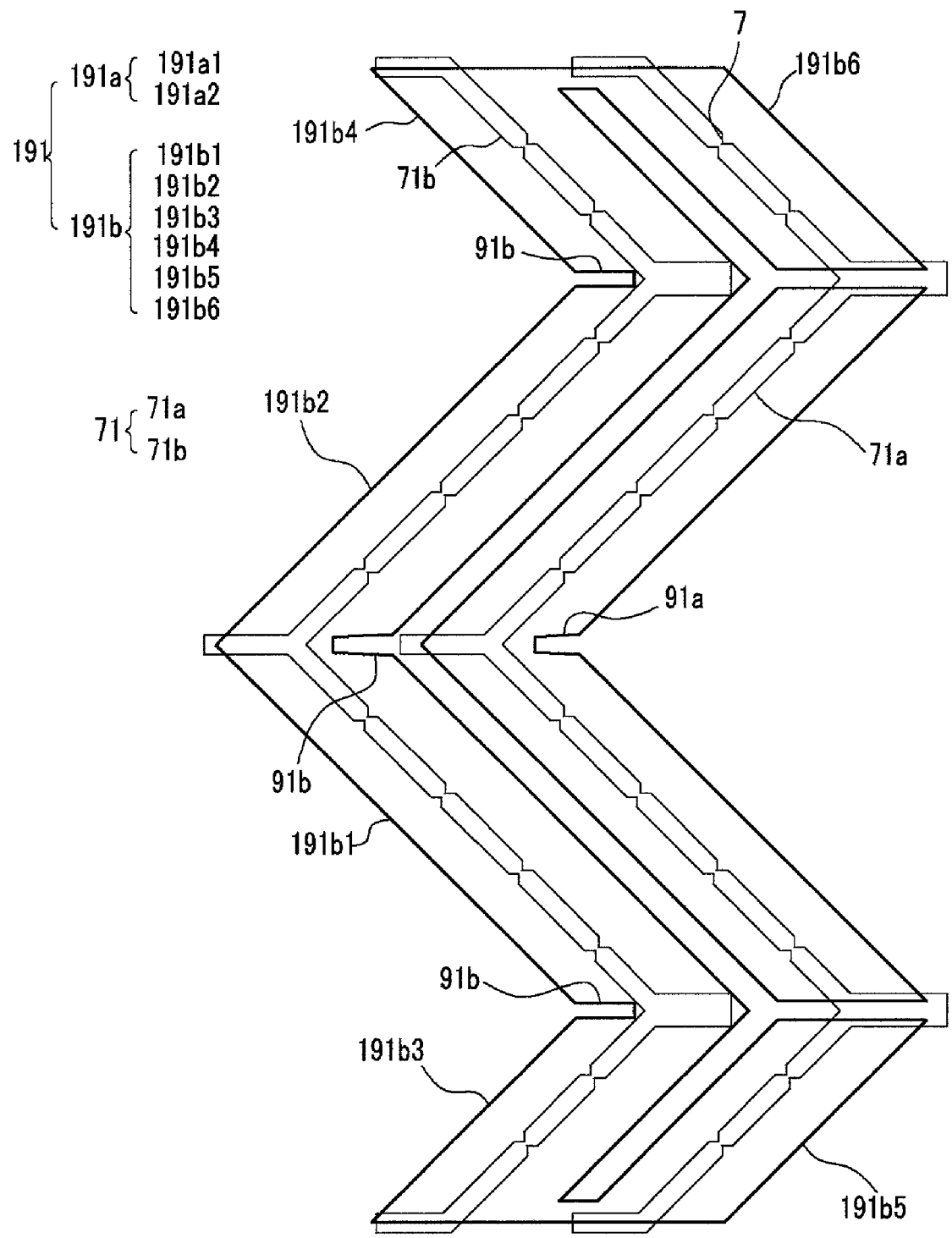
FIG. 9 is a layout view of a pixel electrode and a common electrode in a liquid crystal panel assembly according to various exemplary embodiments of the present invention.
Figure 10A:
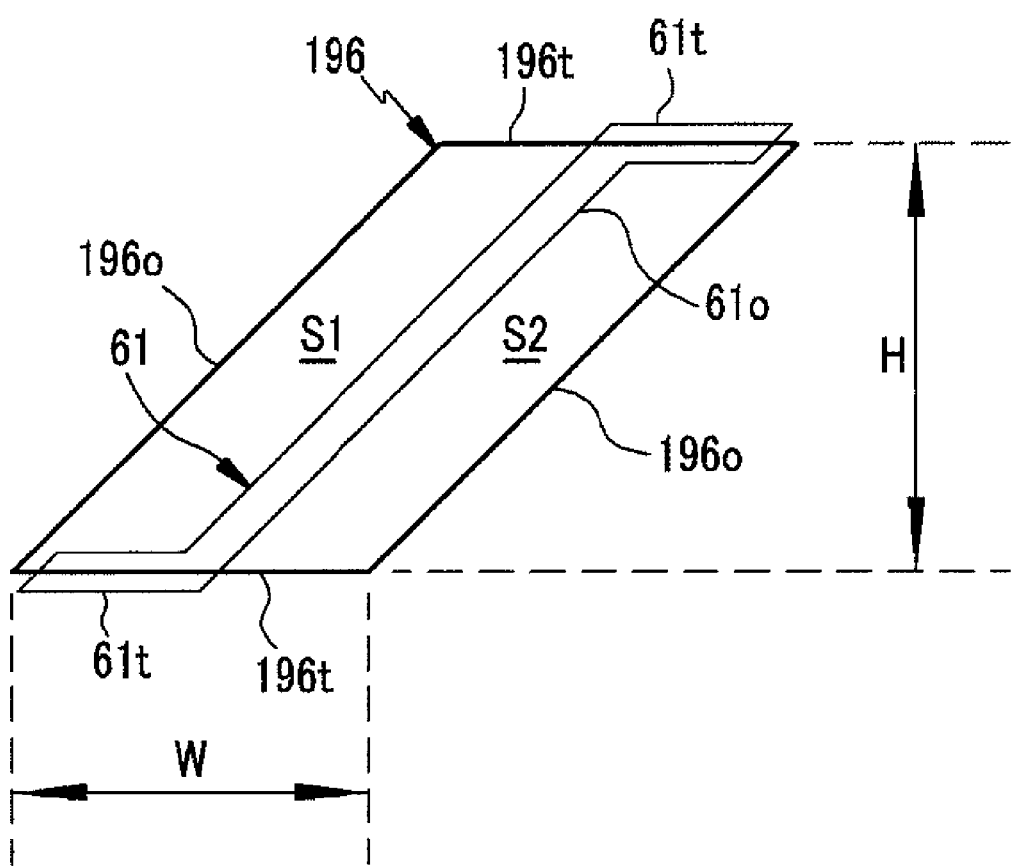
FIGS. 10A to 10C are top planar views of structures used in a subpixel electrode shown in FIG. 9.
Figure 10B:
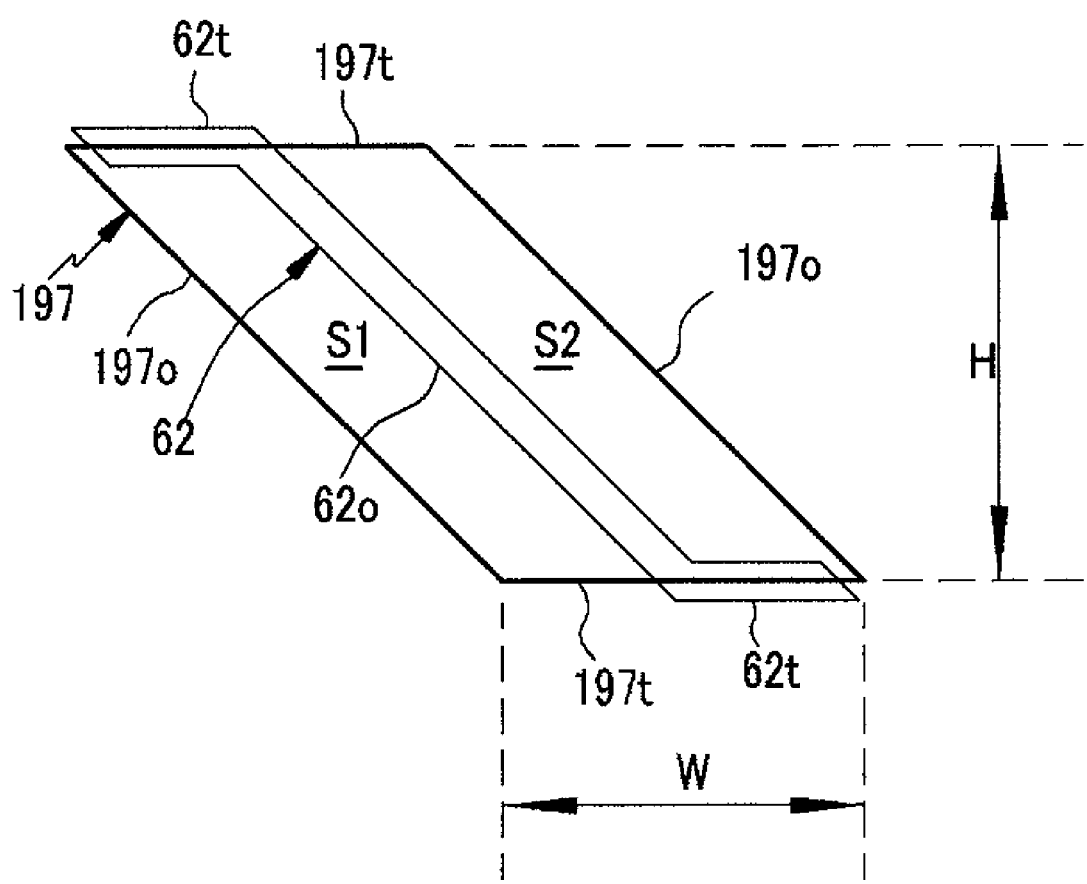
Figure 10C:
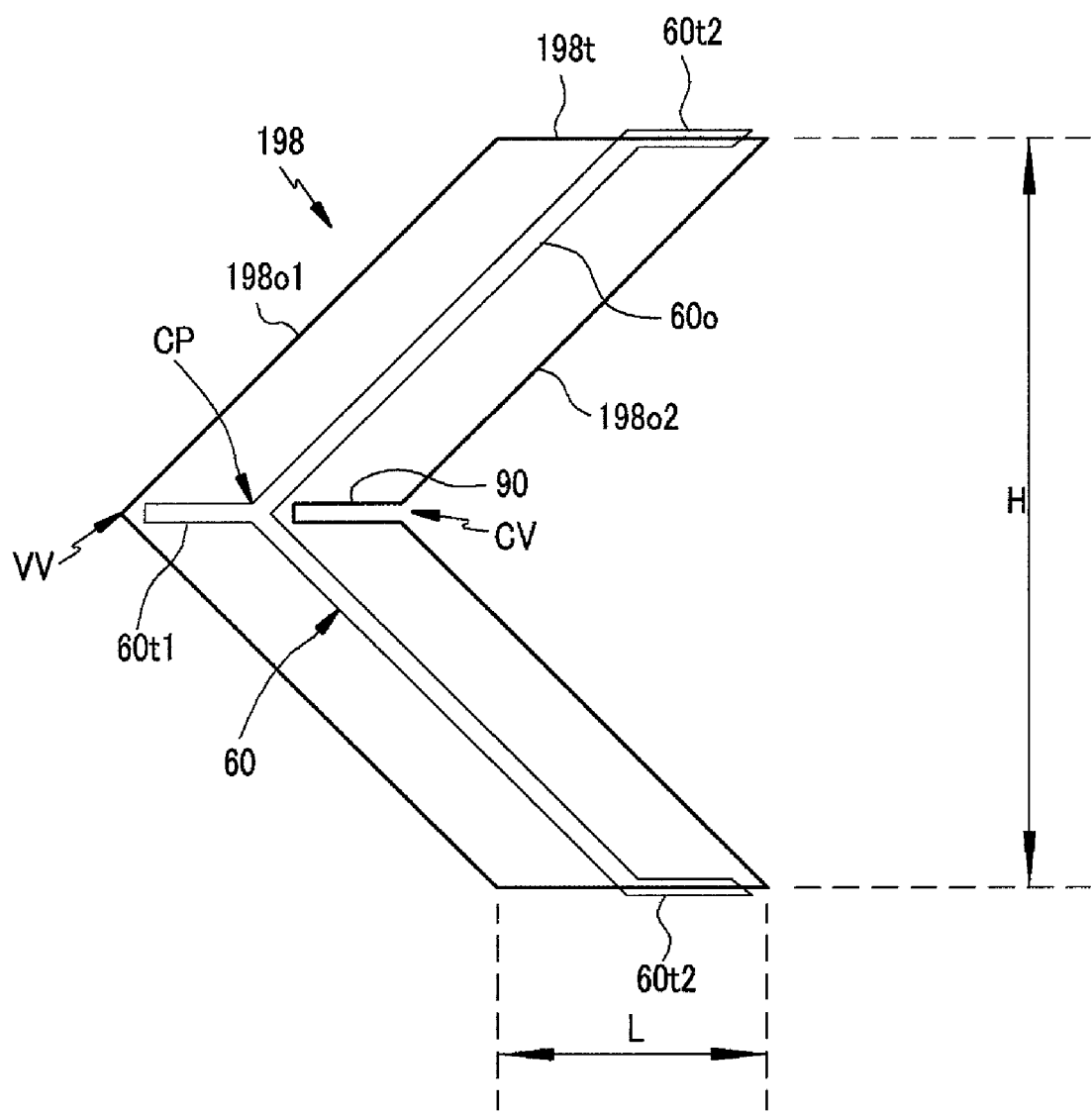

FIG. 9 is a schematic layout view showing one pixel electrode in the liquid crystal panel assembly according to some embodiments of the present invention, and FIGS. 10A to 10C are top planar views showing electrode positioners used to form the pixel electrode of FIG. 9.

As shown in FIG. 9, each pixel electrode 191 of the liquid crystal panel assembly according to an exemplary embodiment of the present invention includes a first subpixel electrode 191a (formed by electrode positioners 191a1, 191a2 described below) and a second subpixel electrode 191b (formed by electrode positioners 191b1 through 191b6 described below). The first and second subpixel electrodes 191a, 191b are adjacent to each other but are separated from each other. They have respective cutouts 91a and 91b. The common electrode 270 (see FIGS. 2, 4) has cutouts 71a and 71b that face the first and second subpixel electrodes 191a and 191b, respectively.

The first and second subpixel electrodes 191a and 191b each include at least one parallelogrammic electrode positioner 196 shown in FIG. 10A and at least one parallelogrammic electrode positioner 197 shown in FIG. 10B. If the electrode positioners 196 and 197 shown in FIG. 10A and FIG. 10B are connected to each other top to bottom, they form a base electrode 198 as shown in FIG. 10C. Each of the subpixel electrodes 191a and 191b includes a structure of base electrode 198.

As shown in FIG. 10A and FIG. 10B, the electrode positioners 196 and 197 are basically parallelogrammic. The electrode positioner 196 has a pair of oblique edges 196o and a pair of transverse edges 196t. The electrode positioner 197 has a pair of oblique edges 197o and a pair of transverse edges 197t. The oblique edges 196o and 197o are at oblique angles to the respective transverse edges 196t and 197t, the oblique angles being preferably in the range of about 45 to 135 degrees. The electrode positioner 196 is sloped from left to right when traced from bottom to top, and will be referred to as a "right-slope" positioner herein. The electrode positioner 197 is sloped from right to left when traced from bottom to top, and will be referred to as a "left-slope" positioner.

The electrode positioners 196 and 197 may have any dimensions as appropriate for the size of the display panel assembly 300. In particular, the width (W) measured as the length of the transverse edge 196t or 197t, and the height (H) measured as the distance between the transverse edges 196t or 197t, can be determined as appropriate for the size of the display panel assembly 300. Also, the transverse edges 196t and 197t do not have to be straight, but may be angled and/or curved, concave and/or convex, The common electrode 270 has cutouts 61 and 62 facing the respective electrode positioners 196 and 197, and the electrode positioners 196 and 197 when viewed from the top are each divided into two sub-regions S1 and S2 by the respective oblique regions 61o, 62o of the respective cutouts 61 and 62. At least one notch 7 is formed in the cutouts 61 and 62. The oblique regions 61o and 62o are straight and parallel to the respective oblique edges 196o and 197o of the electrode positioners 196 and 197. The cutouts 61, 62 also include respective transverse regions 61t, 62t overlapping with the respective transverse edges 196t, 197t of the electrode positioners 196, 197. The transverse regions 61t, 62t form obtuse angles with the respective oblique regions 61o and 62o.

Each of the sub-regions S1 and S2 has two primary edges defined as the edges parallel to the respective oblique line region 61o or 62o of the respective cutout 61 or 62. Each sub-region S1, S2 also has transverse edges which form part of the respective transverse edges 196o and 197o of the respective electrode positioners 196 and 197.

In each sub-region S1, S2, the distance between the primary edges, that is, the sub-region's width, preferably ranges from about 25 to 40 μm.

The base electrode 198 shown in FIG. 10C is formed by attaching a right-slope electrode positioner 196 to a left-slope electrode positioner 197.

The angle between the right-slope electrode positioner 196 and the left-slope electrode positioner 197 is preferably a right angle. The attachment between the electrode positioners 196 and 197 is partial, to provide a concave cutout 90 therebetween. However, the cutout 90 may be omitted.

The base electrode 198 has two transverse edges 198t one of which is provided by a transverse edge 196t of the electrode positioner 196 and the other one of which is provided by a transverse edge 197t of the electrode positioner 197. The respective oblique edges 196o and 197o of the two electrode positioners 196 and 197 meet to form angled edges 198o1 and 198o2 of the base electrode 198.

The angled edge 198o1 is a convex edge forming an obtuse angle, for example about 135°, with the transverse edges 198t. The angled edge 198o2 is a concave edge forming an acute angle, for example about 45°, with the transverse edges 198t. Each of the angled edges 198o1 and 198o2 is bent at roughly a right angle since the oblique edges 196o and 197o meet roughly at a right angle.

The cutouts 61 and 62 of the common electrode 270 meet to form a single cutout 60. One of the transverse regions 61t of the cutout 61 overlaps with one of the transverse regions 62t of the cutout 62 to form a transverse region 60t1.

The resulting cutout 60 includes an angled region 60o having an angle point CP, a central transverse region 60t1 extending from the angle point CP of the angled region 60o, and a pair of transverse regions 60t2 extending from the ends of the angled region 60o. The angled region 60o of the cutout 60 is formed by a pair of straight oblique regions which meet at a right angle and are substantially parallel to the top and bottom halfs of the angled edges 198o1 and 198o2 of the base electrode 198. The angled region 60o of the cutout 60 divides the base electrode 198 into a left half and a right half. The central transverse region 60t1 of the cutout 60 forms an obtuse angle, for example about 135°, with the angled region 60o, and extends to about the convex vertex VV of the base electrode 198. Each transverse region 60t2 is aligned with the respective transverse edge 198t of the base electrode 198 and forms an obtuse angle, for example about 135°, with the angled region 60o.

In some embodiments, the central transverse region 60t1 of the cutout 60 extends to the right to a concave vertext CV of the concave edge 198o2. The central transverse region 60t1 thus may extend from the concave vertex CV of the concave edge 198o2 to the convex vertex VV of the convex edge 198o1.

The base electrode 198 is reflection-symmetric about a straight line (hereinafter, referred to as a "horizontal central line") passing through the convex vertex VV and the concave vertex CV of the base electrode 198. The cutout 60 is reflection-symmetric about a straight line opposite to the horizontal central line and passing through the common electrode 270.

In each pixel, the first subpixel electrode 191a is smaller than the second subpixel electrode 191b. More particularly, the second subpixel electrode 191b has a greater height than the first subpixel electrode 191a, and the two subpixel electrodes 191a, 191b are substantially identical in width. The second subpixel electrode 191b includes more electrode positioners than the first subpixel electrode 191a.

The first subpixel electrode 191a is composed of a left-slope electrode positioner 197 and a right-slope electrode positioner 196, and has substantially the same structure as the base electrode 198 shown in FIG. 10C.

The second subpixel electrode 191*b* is composed of at least two left-slope electrode positioners 197 (three such positioners are used in FIG. 9, and are shown at 191*b*1, 191*b*4, 191*b*6) and at least two right-slope electrode positioners 196 (three such positioners are used in FIG. 9, and are shown at 191*b*3, 191*b*2, 191*b*5). The second subpixel electrode 191*b* includes a base electrode 198 of FIG. 10C (191*b*1, 191*b*2 in FIG. 9) and further includes one or more left-slope electrode positioners 197 (191*b*4, 191*b*6 in FIG. 9) and right-slope electrode positioners 196 (191*b*3, 191*b*5 in FIG. 9) attached to the base electrode 198.

The second subpixel electrode 191*b* shown in FIG. 9 is composed of six electrode positioners 191*b*1 to 191*b*6. The electrode positioners 191*b*5 and 191*b*6 are disposed respectively above and below the first subpixel electrode 191*a*. The pixel electrode 191*b* has a structure that is angled at three points and shows an excellent vertical line presentation, compared to the pixel electrode having a structure angled at just one point. In the regions in which the top and bottom edges of the subpixel electrode 191*a* face the respective bottom and top edges of the respective electrode positioners 191*b*6 and 191*b*5, the respective transverse regions 61*t* and 62*t* of the cutouts 61 and 62 in the common electrode 270 merge into a single transverse region, improving the aperture ratio.

The heights of the intermediate electrode positioners 191*a*1, 191*a*2, 191*b*1, and 191*b*2 are different from those of electrode positioners 191*b*3 to 191*b*6 disposed above and below the intermediate electrode positioners 191*a*1, 191*a*2, 191*b*1, and 191*b*2 in the view of FIG. 9. In some embodiments, the heights of the upper and lower electrode positioners 191*b*3 to 191*b*6 are each about one half of the height of each intermediate electrode positioner 191*a*1, 191*a*2, 191*b*1, and 191*b*2, and consequently the first subpixel electrode 191*a* and the second subpixel electrode 191*b* have an area ratio of about 1:2. A desired area ratio may be obtained by adjusting the heights of the upper and lower electrode positioners 191*b*3 to 191*b*6.

The invention is not limited to the pixel electrode geometry of FIG. 9. Other geometries can be obtained, for example, by stretching and/or shrinking the pixel electrode 191 of FIG. 9 horizontally and/or vertically, and/or by rotating the pixel electrode. Similar transformations (stretching, shrinking, rotation) can be applied to one or both of individual subpixel electrodes 191*a*, 191*b* to achieve other possible geometries. Moreover, the subpixel electrode 191*a* can be translated right or left relative to the subpixel electrode 191*b*.

Referring again to FIG. 4 to FIG. 8, the first and second subpixel electrodes 191*a* and 191*b*, the common electrode 270 of the upper panel 200, and the liquid crystal material 3 between the first and second electrodes 191*a*, 191*b* and the common electrode 270 form the first and second liquid crystal capacitors Clca and Clcb, which maintain the pixel voltage when the thin film transistors Qa and Qb are turned off.

The first and second subpixel electrodes 191*a*/191*b* overlap with a storage electrode 137, and together with a gate dielectric layer 140 interposed therebetween they provide the first and second storage capacitors Csta and Cstb, respectively. The first and second storage capacitors Csta and Cstb help maintain the voltage on the respective first and second liquid crystal capacitors Clca and Clcb.

Each pixel electrode 191 (except possibly for the pixel electrodes in the leftmost and/or rightmost columns of the display) overlaps with multiple data lines 171, the passivation layer 180 being interposed therebetween. In the embodiment being described, the pixel electrode 191 overlaps with a data line 171*s* ("self data line" hereinbelow) and is connected to the self data line through a thin film transistor. The pixel electrode 191 also overlaps with a data line 171*n* ("neighboring data line" hereinbelow) adjacent to the self data line 171*s*. There is no thin film transistor connection between the pixel electrode 191 and the neighboring data line 171*n*. Each data line 171 has a structure that is angled at several points to overlap with two adjacent pixel electrodes 191 in each row (except possibly for the leftmost and/or rightmost data lines of the display). In the embodiment being described, the overlap area of the pixel electrode 191 and the self data line 171*s* is substantially identical to the overlap area of the pixel electrode 191 and the neighboring data line 171*n*. In particular, the overlap area of the pixel electrode 191 and the self data line 171*s* is substantially identical to the overlap area of the neighboring data line 171*n* and the first subpixel electrode 191*a* of the pixel electrode 191.

Light blocking films 120 are formed under some of the straight line segments of the semiconductor strips 151*s* and 151*n* and data lines 171.

Figure 7:
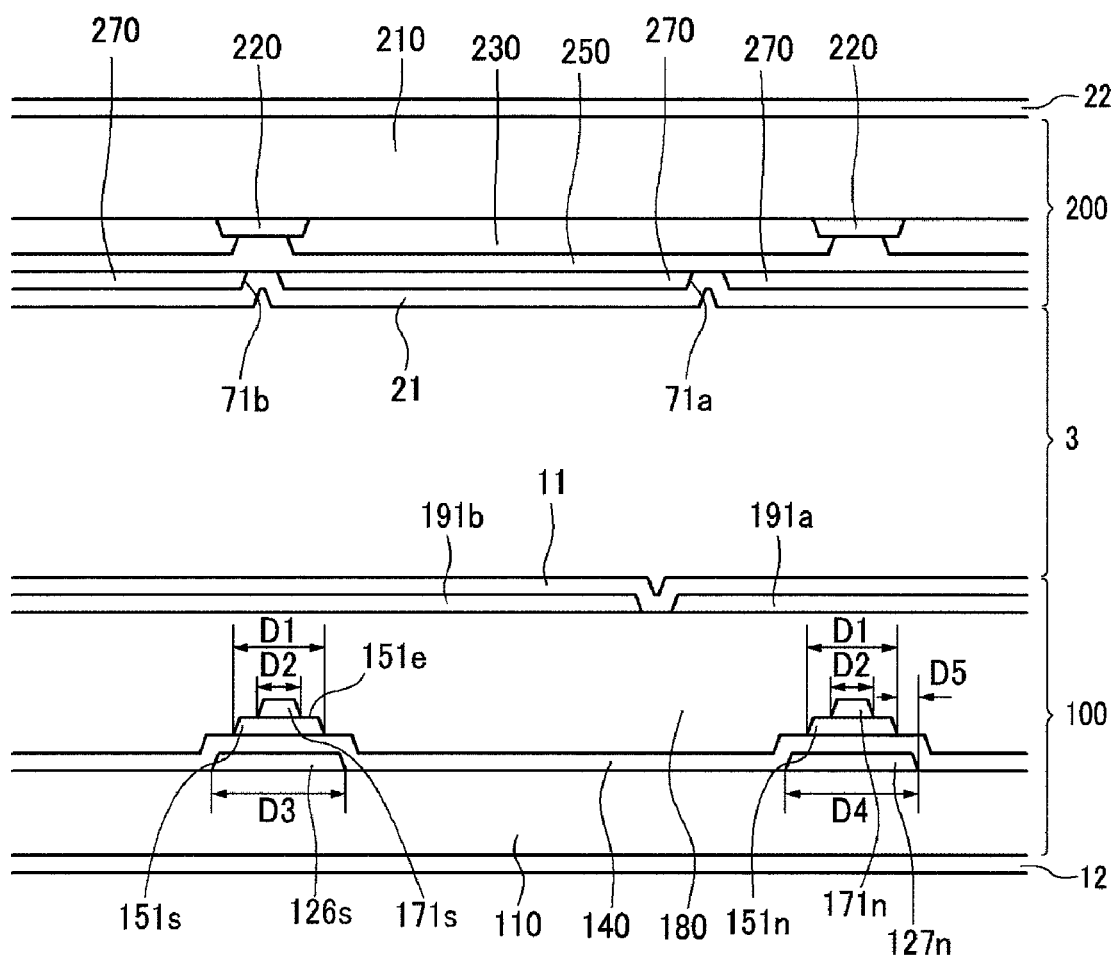
Figure 8:
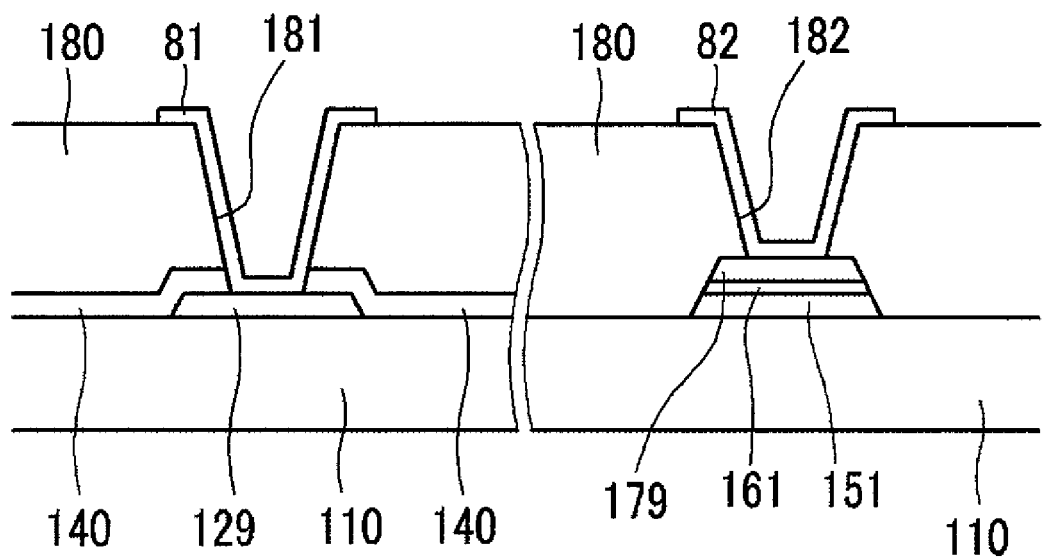

Of note, in the transversal vertical cross section of FIG. 7, the width D3 of the light blocking film 126*s*, formed in the area of overlap between the data line 171*s* and the second subpixel electrode 191*b*, is substantially identical to the width D1 of the semiconductor strip 151*s*. Therefore, the light blocking film 120 does not cause a large reduction in the aperture ratio.

Similar width relationships are true for the light blocking films 122*s*, 123*s* (and of course 122*n*, 123*n*, 126*n*, since the light blocking films and the strips 151 are identical for the data lines 171*s*, 171*n*).

The light blocking films 127*s*, 127*n* are wider however in order to provide improved shielding in the areas of overlap between the semiconductor strips 151 and the subpixel electrodes 191*a*. (The improved shielding in these areas may be desirable in order to increase the viewing angle, as described below in connection with FIG. 14.) As shown in FIG. 7, the width D4 of the light blocking film 127*n*, formed in the area of overlap between the data line 171*n* and the first subpixel electrode 191*a*, is significantly greater than the width D1 of the semiconductor strip 151*n*. The distance D5 between the longitudinal edge of the semiconductor strip 151*n* and the adjacent longitudinal edge of the light blocking film 127*n* is preferably greater than 3 µm. Therefore, large manufacturing tolerances are provided to ensure proper positioning of the semiconductor strips 151*s* and 151*n* relative to the light blocking films 127*s* and 127*n*.

However, the invention is not limited to these dimensions, and the width of the light blocking film 120 may be adjusted as needed to provide a desired aperture ratio and manufacturing tolerances.

Contact liners 81*a*, 81*b* and 82 physically contact the ends 129*a* and 129*b* of the gate lines 121*a* and 121*b* and the ends 179 of the data lines 171 in respective contact holes 181*a*, 181*b* and 182. The contact liners 81*a*, 81*b* and 82 improve and protect the contact structures at the ends 129*a* and 129*b* of the gate lines 121*a* and 121*b* and the ends 179 of the data lines 171. These contact structures provide connection to external devices.

The upper panel 200 will now be described in detail.

A light blocking member 220 (FIGS. 6, 7) is formed on an insulation substrate 210 made of transparent glass or plastic. The light blocking member 220 includes angled regions corresponding to the respective angled edges of the pixel electrodes 191 and quadrangle regions corresponding to the respective thin film transistors. These angled and quadrangle regions of the light blocking member 220 prevent light leakage between the pixel electrodes 191 and define aperture regions facing the pixel electrodes 191.

A plurality of color filters 230 are formed over the substrate 210 and the light blocking member 220. The color filters 230 are mainly present inside regions surrounded by the light blocking member 220 and may extend along an array of the pixel electrodes 191. Each of the color filters 230 may have one of the three primary colors, such as red, green, or blue.

An overcoat 250 is formed on the color filters 230 and the light blocking member 220. The overcoat 250 may be made of an (organic) dielectric material. The overcoat 250 protects the color filters 230 and provides a planar surface facing the lower panel 100. The overcoat 250 may be omitted.

The common electrode 270 is formed on the overcoat 250.

A plurality of cutouts 71a and 71b are formed in the common electrode 270.

Alignment layers 11 and 21 are formed on the inner surfaces of the display panels 100 and 200. The alignment layers 11, 21 may be vertical alignment layers.

Polarizers 12 and 22 are provided on the outer surfaces of the display panels 100 and 200, and it is preferable for the polarization axes of the two polarizers 12 and 22 to be perpendicular to each other and one of the polarization axes be parallel to the gate lines 121a and 121b. One of the two polarizers 12 and 22 may be omitted in the case of a reflective liquid crystal display.

Thus, in some embodiments of the present invention, a liquid crystal display includes the polarizers 12 and 22, a phase delay film, the display panels 100 and 200, and a backlight unit 900 for supplying light to the liquid crystal layer 3.

The liquid crystal layer 3 has negative dielectric anisotropy, and liquid crystal molecules of the liquid crystal layer 3 are arranged so that their longitudinal axes are perpendicular to the surface of the two display panels when no electric field is applied.

The operation of the liquid crystal display will now be described in detail.

An outside graphic controller supplies to the signal controller 600 (FIG. 1) input image signals R, G, B and input control signals (Vsync, Hsync, MCLK, DE) for controlling the display of the input image signals R, G, B. The input image signals R, G, and B include luminance information for the pixels PX. Each primary color has a predetermined number of possible "gray" luminance levels, for example 1024 ($=2^{10}$), 256 ($=2^{8}$) or 64 ($=2^{6}$) levels.

The input control signals may include, for example, a vertical synchronization signal Vsync, a horizontal synchronizing signal Hsync, a main clock MCLK, a data enable signal DE, etc.

The signal controller 600 processes the input image signals R, G, B as appropriate for the operating conditions of the liquid crystal panel assembly 300 and the data driver 500. Based on the input image signals R, G, and B and the input control signals, the signal controller 600 generates a gate control signal CONT1, a data control signal CONT2, and processed image signals DAT. The signal controller 600 transmits the gate control signal CONT1 to the gate driver 400, and transmits the data control signal CONT2 and the processed image signals DAT to the data driver 500. The output image signals DAT are digital signals whose values correspond to the luminances defined by the input image signals R, G, B.

The gate control signal CONT1 includes a scanning start signal STV for directing the start of scanning and at least one clock signal for controlling the output timing of the gate-on voltage Von.

The gate control signal CONT1 may also include an output enable signal OE for defining the duration of the gate-on voltage Von.

The data control signal CONT2 includes a horizontal synchronization start signal STH for signaling the transmission start of image data for a group of subpixels, a load signal LOAD for applying data signals to the liquid crystal panel assembly 300, and a data clock signal HCLK. The data control signal CONT2 may also include an inversion signal RVS for inverting voltage polarities of the data signals relative to the common voltage Vcom. The voltage polarities of the data signals are called simply "data signal polarities" hereinbelow.

The data driver 500 receives the digital image signals DAT for a group of subpixels together with the data control signal CONT2 from the signal controller 600, converts the digital image signals DAT to analog data signals by selecting a gray voltage for each of the digital image signals DAT, and applies the analog data signals to the corresponding data lines.

The gate driver 400 applies the gate-on voltage Von to the appropriate gate lines based on the gate control signal CONT1 from the signal controller 600 to turn on the switching elements connected to the gate lines. As a result, the data signals on the data lines are applied to the corresponding subpixels through the conductive switching elements.

As a result, the first subpixel electrode 191a and the second subpixel electrode 191b of each of selected pixel electrodes 191 are connected to a respective data line via the respective switching elements, and the data line's voltage is applied to the two subpixels through the same data lines at different times. The first subpixel electrodes 191a and the second subpixel electrodes 191b of different pixels 191 in the same row are connected to different data lines via the respective switching elements, and therefore different voltages can be applied to subpixels connected to different data lines at the same time.

In other embodiments (not shown), the switching elements Qb are omitted. Thus, the first subpixel electrodes 191a are connected to the respective data lines via the respective switching elements Qa, but no such connection is present for the second subpixel electrodes 191b. The second subpixel electrodes 191b are capacitively coupled to the first subpixel electrodes 191a. In such embodiments, in each pixel 191 in a given row, when the row's gate line receives the voltage Von and the data voltage is applied to the first subpixel electrode 191a through the switching element Qa, the second subpixel electrode 191b may be at a different voltage that the first subpixel electrode 191a. The voltage of the second subpixel electrode 191b depends on the voltage changes of the first subpixel electrode 191a. Since the first subpixel electrode 191a has a relatively small area, its voltage can be higher than that of the relatively large second subpixel electrode 191b.

As described above, a primary electric field that is almost vertical to the surface of the display panels 100 and 200 is generated in a liquid crystal layer 3 if a potential difference is generated between the electrodes of the first liquid crystal capacitor Clca or second liquid crystal capacitor Clcb. Below, the pixel electrodes 191 and the common electrode 270 are referred to as "field generating electrodes". In response to the electric field between the electrodes of the liquid crystal capacitor Clca or Clcb, the liquid crystal molecules of the liquid crystal layer 3 are tilted so that their longitudinal axes are perpendicular to the direction of the electric field, and the polarization of the light incident to the liquid crystal layer 3 changes according to the tilt of the liquid crystal molecules.

The polarization changes affect the transmittance of the polarizer to form a desired image on the liquid crystal display.

The tilt angles of the liquid crystal molecules depend on the magnitude of the electric field. The tilt angles of different liquid crystal molecules can be different from each other because the voltages of the two liquid crystal capacitors Clca and Clcb can be different from each other, and therefore the two subpixels of a single pixel can have different luminances. The voltages of the first liquid crystal capacitor Clca and the second liquid crystal capacitor Clcb can be adjusted to make a side view of an image closer to the front view, or in other words to make a side gamma curve closer to the front gamma curve, resulting in improved side visibility.

The side gamma curve can be made closer to the front gamma curve if the area of the first subpixel electrode 191a, to which a high voltage is applied, is made smaller than the area of the second subpixel electrode 191b. In particular, side visibility is improved (due to the side gamma curve becoming closer to the front gamma curve) if the area ratio of the first to second subpixel electrodes 191a and 191b ranges from about 1:2 to 1:3.

The tilt direction of the liquid crystal molecules is primarily determined by the horizontal component of the electric field. The horizontal component is present because of the electric field distortion due to the cutouts 71a and 71b facing the field generating electrodes 191 and because of the electric field distortion at the edges of the subpixel electrodes 191a and 191b. The horizontal component of the primary electric field is almost perpendicular to the edges of the cutouts 71a and 71b and the edges of the subpixel electrodes 191a and 191b.

Referring to FIG. 9, there are basically four tilt directions since most of the liquid crystal molecules in each of the sub-regions separated by the cutouts 71a and 71b are tilted towards the primary edges. As described above, the reference viewing angle can be increased by adjusting the tilt direction of the liquid crystal molecules.

There is also a secondary electric field generated by the voltage difference between the subpixel electrodes 191a and 191b. The secondary electric field is perpendicular to the primary edges of the sub-regions. Accordingly, the direction of the horizontal component of the primary electric field is identical to the direction of the secondary electric field. The secondary electric field between the subpixel electrodes 191a and 191b contributes to define the tilt direction of the liquid crystal molecules.

The liquid crystal display operation procedure described above is repeated each horizontal period "1H" (equal to the period of the horizontal synchronizing signal Hsync and of the data enable signal DE). An image frame is displayed when the data signals have been applied to all the pixels PX.

Once one frame ends, the next frame starts, and the inversion signal RVS applied to the data driver 500 is controlled so that the polarity of the data signal applied to each of the pixels PX is inverted relative to the previous frame. In frame inversion driving, all the pixels have the same polarity within a frame. In other types of driving, the inversion signal RVS can be controlled to change a data line's polarity within one frame (examples are row inversion driving and dot inversion driving). Also, different data lines may have different polarities at the same time (examples are column inversion driving and dot inversion driving).

Further aspects of operation of the liquid crystal display according to the exemplary embodiment of the present invention will now be described with reference to FIG. 11 to FIG. 14.

Figure 11:
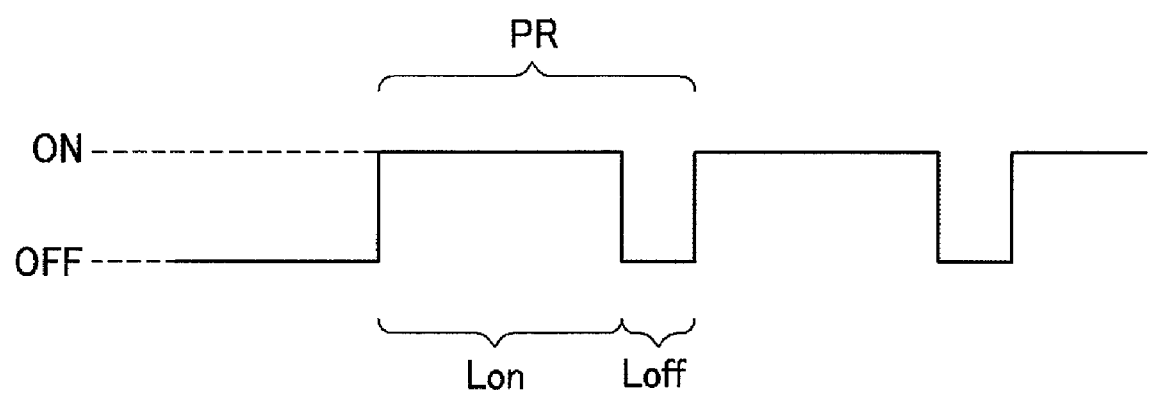
FIG. 11 is a timing diagram for a backlight unit in a liquid crystal display according to an exemplary embodiment of the present invention.

FIG. 11 is a timing diagram showing the operation of the backlight unit in the liquid crystal display according to this exemplary embodiment. The backlight unit emits suitably dimmed light. More particularly, the backlight unit is turned on during the first period Lon to emit light toward the liquid crystal assembly display panel 300, and turned off during the second period Loff not to emit light. The backlight unit is turned on and off with a regular period PR.

Semiconductor strips 151s and 151n formed under the data lines 171 serve as insulators when the backlight unit is turned off, but they serve as conductors if exposed to light such as the light emitted by the backlight unit. If the light blocking films 120 were absent, then the semiconductor strips 151s, 151n would be exposed to the light from the backlight unit, and parasitic capacitance would be generated in the regions between the edge portions 151e of the semiconductor strips 151s and 151n on the one hand and the pixel electrodes 191 on the other hand. This parasitic capacitance would change the pixel electrode voltage Vpix. This will now be described in detail with reference to FIG. 12A and FIG. 12B.

Figure 12A:
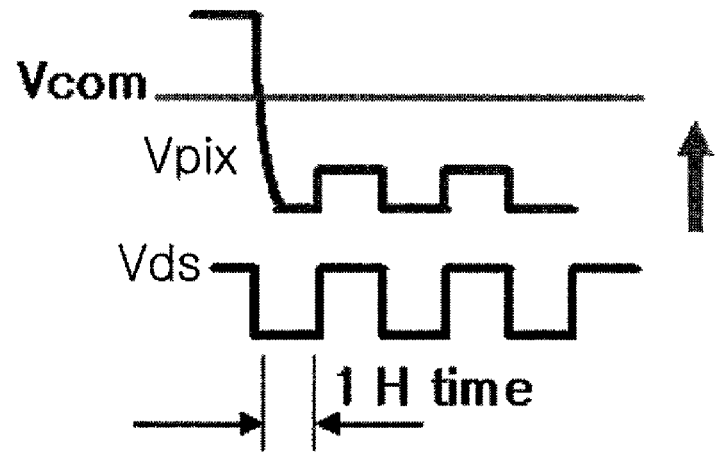
FIG. 12A and FIG. 12B are timing diagrams showing a pixel electrode voltage and a data voltage in a variation of a liquid crystal display according to some embodiments of the present invention.
Figure 12B:
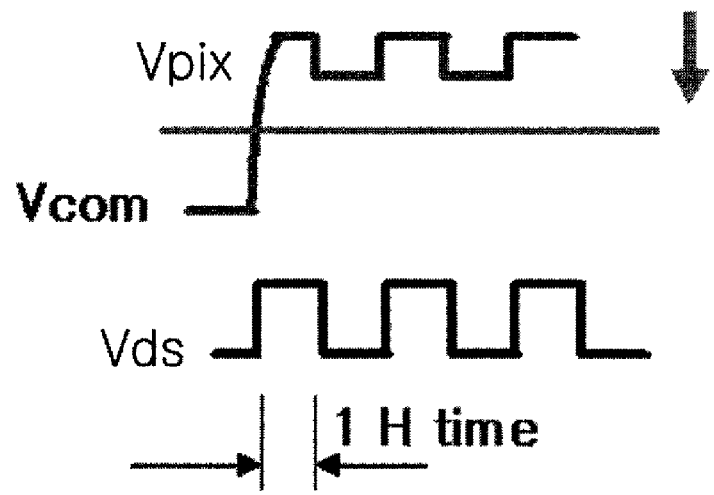

FIG. 12A and FIG. 12B are timing diagrams showing hypothetical waveforms of data signals Vds in the absence of the light blocking films 120. FIG. 12A shows a data signal Vds for a pixel electrode having negative polarity (−), and FIG. 12B shows a data signal Vds for a pixel electrode having positive polarity (+).

Referring to FIG. 12A, the negative polarity voltage Vds fluctuates due to the intermittent generation of the parasitic capacitance between the semiconductor strips 151 and the pixel electrodes 191 when the backlight unit is turned on. The pixel electrode voltage Vpix fluctuates accordingly, and its average value is slightly increased (as compared to the backlight unit being permanently off).

Referring to FIG. 12B, the positive polarity voltage Vds fluctuates due to the intermittent generation of the parasitic capacitance between the semiconductor strips 151 and the pixel electrodes 191 when the backlight unit is turned on. The pixel electrode voltage Vpix fluctuates accordingly, and its average value is slightly decreased (as compared to the backlight unit being permanently off).

In both cases, the average pixel voltage Vpix depends on the timing of the corresponding data signal Vds relative to the backlight unit. If the backlight unit is off most of the time when the data signal Vds is applied, then the voltage Vpix does not fluctuates much. If however the backlight unit is turned on and off in resonance with the data signal, the Vpix fluctuation is greater. A waterfall phenomenon occurs as a result.

The light blocking film 120, formed under the semiconductor strips 151s and 151n as described above, shields the semiconductor strips 151s and 151n from the light emitted by the backlight unit. Therefore, the semiconductor strips 151s and 151n do not conduct even when the backlight unit is on, and hence no parasitic capacitance is generated between the semiconductor strips 151s, 151n and the pixel electrodes 191. Accordingly, the waterfall phenomenon is eliminated.

Even if some light emitted by the backlight unit reaches the semiconductor strips 151, the waterfall generation is precluded in some embodiments of the present invention due to the pixel electrodes 191 overlapping both with the self data lines 171s and the neighboring data lines 171n. This will now be explained in detail with reference to FIG. 13A and FIG. 13B.

Figure 13A:
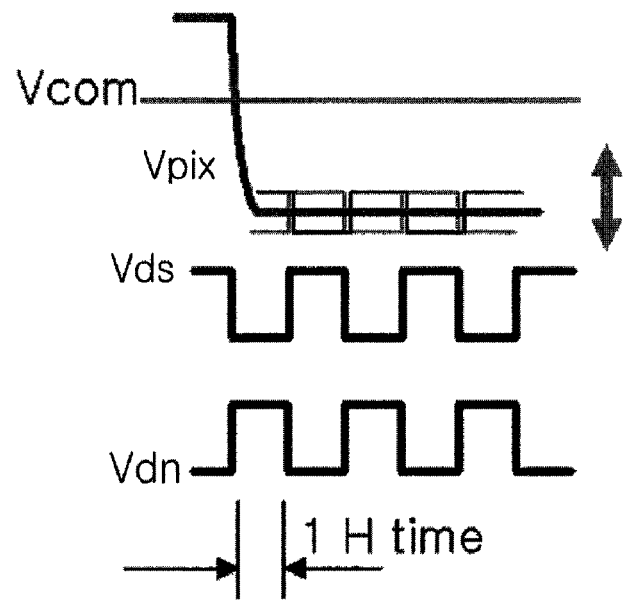
FIG. 13A and FIG. 13B are timing diagrams showing a pixel electrode voltage and a data voltage in a liquid crystal display according to an exemplary embodiment of the present invention.
Figure 13B:
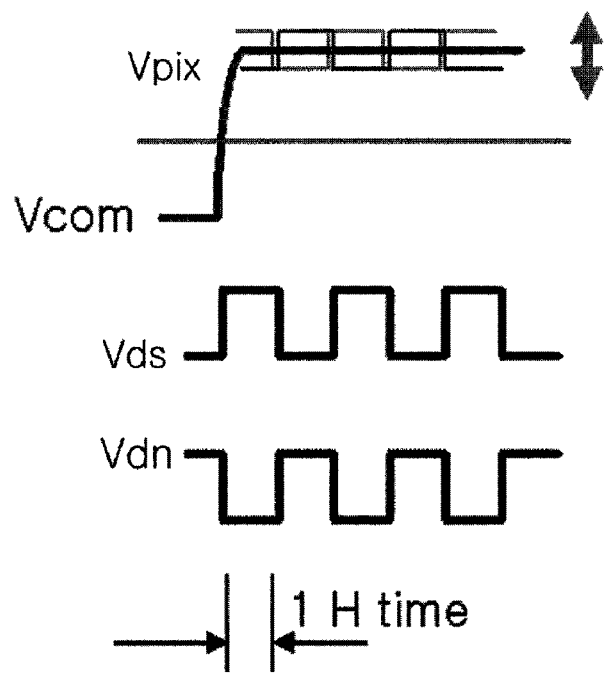

FIG. 13A and FIG. 13B are timing diagrams showing the pixel voltage Vpix and the corresponding data signals Vds, Vdn on the respective adjacent data lines 171s, 171n for column inversion driving in some embodiments of the present invention. FIG. 13A shows the case when the pixel voltage Vpix has negative polarity (−), and FIG. 13B shows the case when the pixel voltage Vpix has positive polarity (+).

In both cases, the self data line 171s and the neighboring data line 171n have opposite polarities. In FIG. 13A, the self data line 171s has negative (−) polarity, and the neighboring data lines 171n has positive polarity. The voltage Vds of the self data line 171s is positive, the voltage Vdn of the neighboring data lines 171n is negative, and both voltages Vds, Vdn fluctuate due to the generation of the parasitic capacitance between the semiconductor strips 151s, 15 in and the pixel electrode 191 when the backlight unit is turned on. The voltage fluctuations of the self data line voltage Vds and the neighboring data line voltage Vdn are opposite in phase since the self data line 171s and the neighboring data line 171n have opposite polarities. The voltage fluctuations on the two data lines offset each other at the pixel electrode 191 because the pixel electrode voltage Vpix is affected both by the voltage Vds of the self data lines 171s and the voltage Vdn of the neighboring data lines 171n. As a result, the backlight unit has little or no effect on the pixel electrode voltage Vpix.

Referring to FIG. 13B, the voltage Vds of the self data line 171s has positive (+) polarity, and the voltage Vdn of the neighboring data line 171n has negative (−) polarity. The voltage Vds fluctuates due to the parasitic capacitance generated between the semiconductor strips 151s and the pixel electrodes 191 when the backlight unit is turned on. The voltage Vdn fluctuates due to the generation of the parasitic capacitance between the semiconductor strips 151n and the pixel electrodes 191. The fluctuations of the voltage Vds and the voltage Vdn offset each at the pixel electrode 191, so the pixel electrode voltage Vpix is protected from the impact of the backlight unit.

Accordingly, the waterfall phenomenon is prevented or reduced in magnitude since the pixel electrode voltage Vpix is protected from impact of the backlight unit on the semiconductor strips 151s and 151n.

Further aspects of the operation of the liquid crystal display according to the present exemplary embodiment of the present invention will now be described in detail with reference to FIG. 14.

Figure 14:
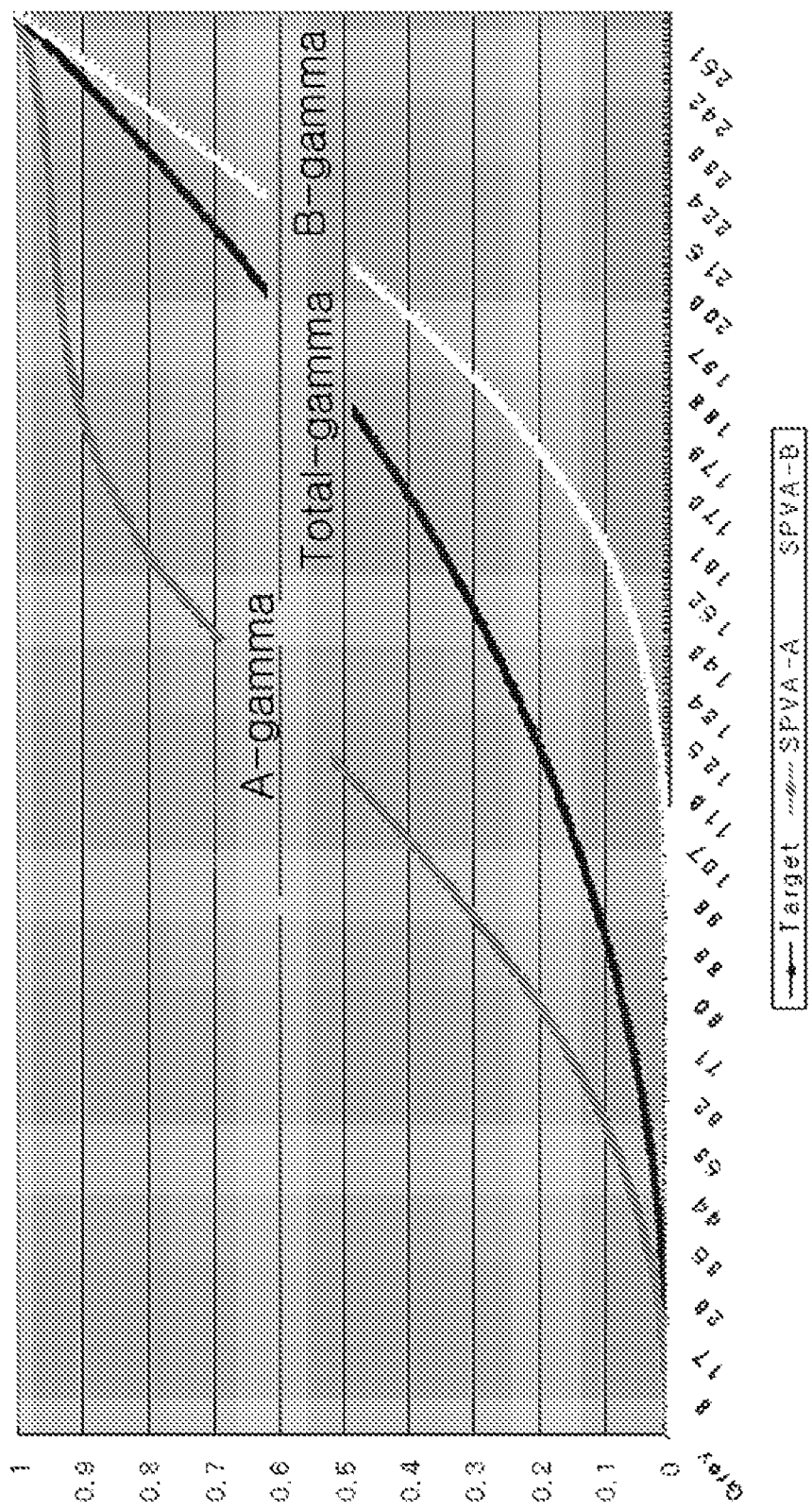
FIG. 14 is a graph showing gamma curves for a liquid crystal display according to an exemplary embodiment of the present invention.

FIG. 14 is a graph showing gamma curves for the liquid crystal display according to the present embodiment.

As described above, the pixel electrode 191 of the liquid crystal display according to the present embodiment includes the first and second subpixel electrodes 191a and 191b, which are spaced apart from each other. The first subpixel electrode 191a corresponds to the gamma curve "A-gamma" in FIG. 14, and the second subpixel electrode 191b corresponds to the gamma curve "B-gamma". The two gamma curves can be synthesized to obtain the gamma curve entire for the pixel. The synthesized gamma curve is shown as "Total-gamma".

The waterfall phenomenon is more noticeable at low light intensities ("low grays"). At the low intensities, the total gamma curve is near the A-gamma curve because the B-gamma curve is near 0. Therefore, it is important to lower the voltage fluctuation of the first subpixel electrode 191a. Accordingly, it is preferable for the first subpixel electrode 191a to have the same overlap area with the self data line 171s as with the neighboring data line 171n.

Also, it is desirable to adjust the light blocking film 120 to provide greater shielding of the semiconductor strips 151s and 151n in the areas in which the semiconductor strips 151s and 151n overlap with the first subpixel electrode 191a. In particular, the light blocking film 120 can be made wider in these areas (as shown in FIGS. 4, 7 with respect to the light blocking films 127s, 127n), and/or the relative width may be increased in these areas between the light blocking film 120 and the semiconductor strips 151s and 151n, and/or the light blocking film 120 may be provided only in these areas (and omitted elsewhere). In the latter case, the aperture ratio may be increased.

An exemplary embodiment of a method for manufacturing the thin film transistor array panel 100 of the liquid crystal display shown in FIGS. 4 to 8 will now be described in detail with reference to FIGS. 15A to 18B.

FIG. 15A, FIG. 16A, FIG. 17A, and FIG. 18A are top views of some features of the thin film transistor array panel of the liquid crystal display shown in FIGS. 4 to 8 at consecutive fabrication stages according to the exemplary embodiment, and FIG. 15B, FIG. 15C, FIG. 16B, FIG. 16C, FIG. 17B, FIG. 17C, and FIG. 18B are cross-sectional views taken along the lines XVb-XVb, XVc-XVc, XVIb-XVIb, XVIc-XVIc, XVIIb-XVIIb, XVIIc-XVIIc, and XVIIIb-XVIIIb respectively.

Figure 15A:
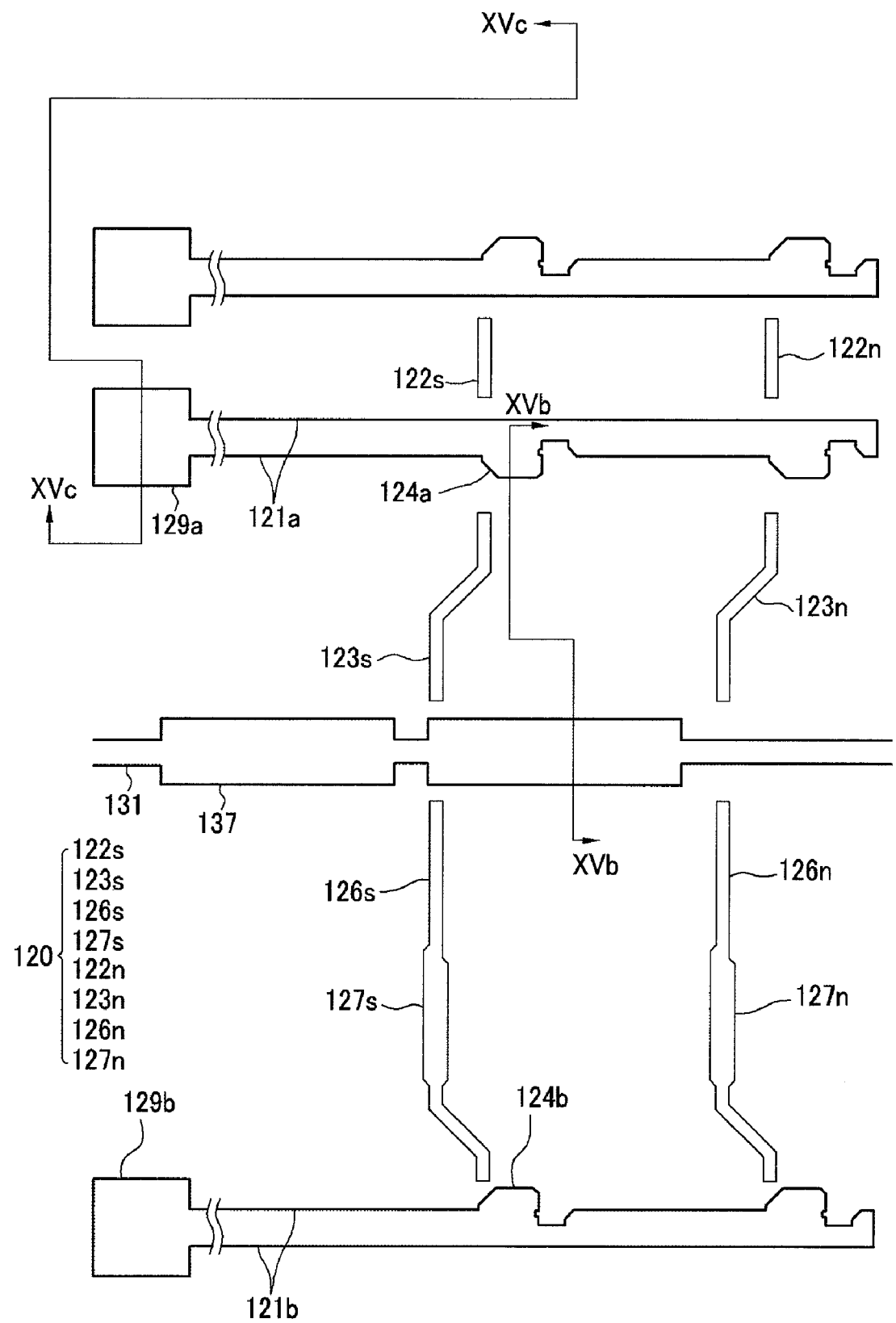
FIG. 15A, FIG. 16A, FIG. 17A, and FIG. 18A are layout views of a thin film transistor array panel of the liquid crystal display of FIG. 4 at different stages of fabrication.
Figure 15B:
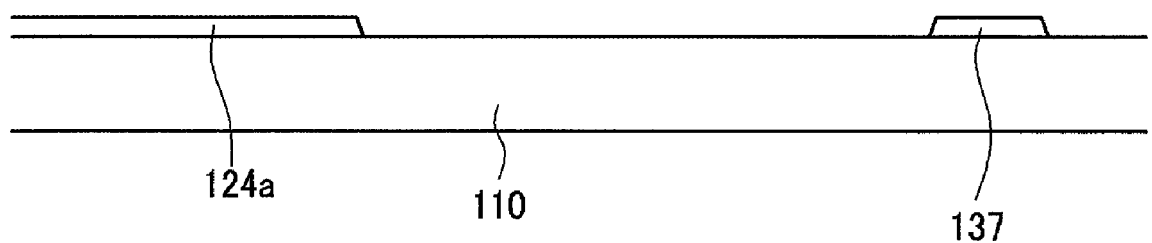
FIG. 15B, FIG. 15C, FIG. 16B, FIG. 16C, FIG. 17B, FIG. 17C, and FIG. 18B are cross-sectional views of the thin film transistor array panel of the liquid crystal display of FIG. 4 taken along the lines XVb-XVb, XVc-XVc, XVIb-XVIb, XVIc-XVIc, XVIIb-XVIIb, XVIIc-XVIIc, and XVIIIb-XVIIIb.
Figure 15C:
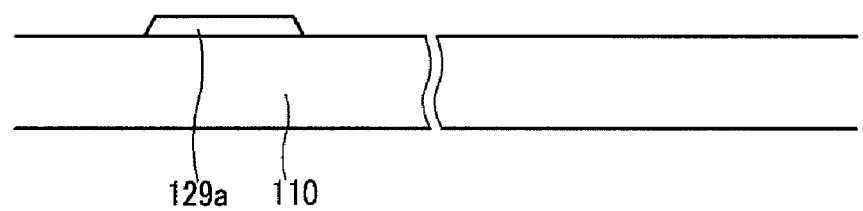

Referring to FIG. 15A, FIG. 15B, and FIG. 15C, a metal film is sputtered on the substrate 110, and then subjected to photolithography to form the first and second gate lines 121a and 121b with their first and second gate electrodes 124a and 124b and their widened ends 129a and 129b, the storage electrode lines 131 with their storage electrodes 137, and the light blocking film 120 with its regions 122s, 122n, 123s, 123n, 126s, 126n, 127s, and 127n.

Figure 16A:
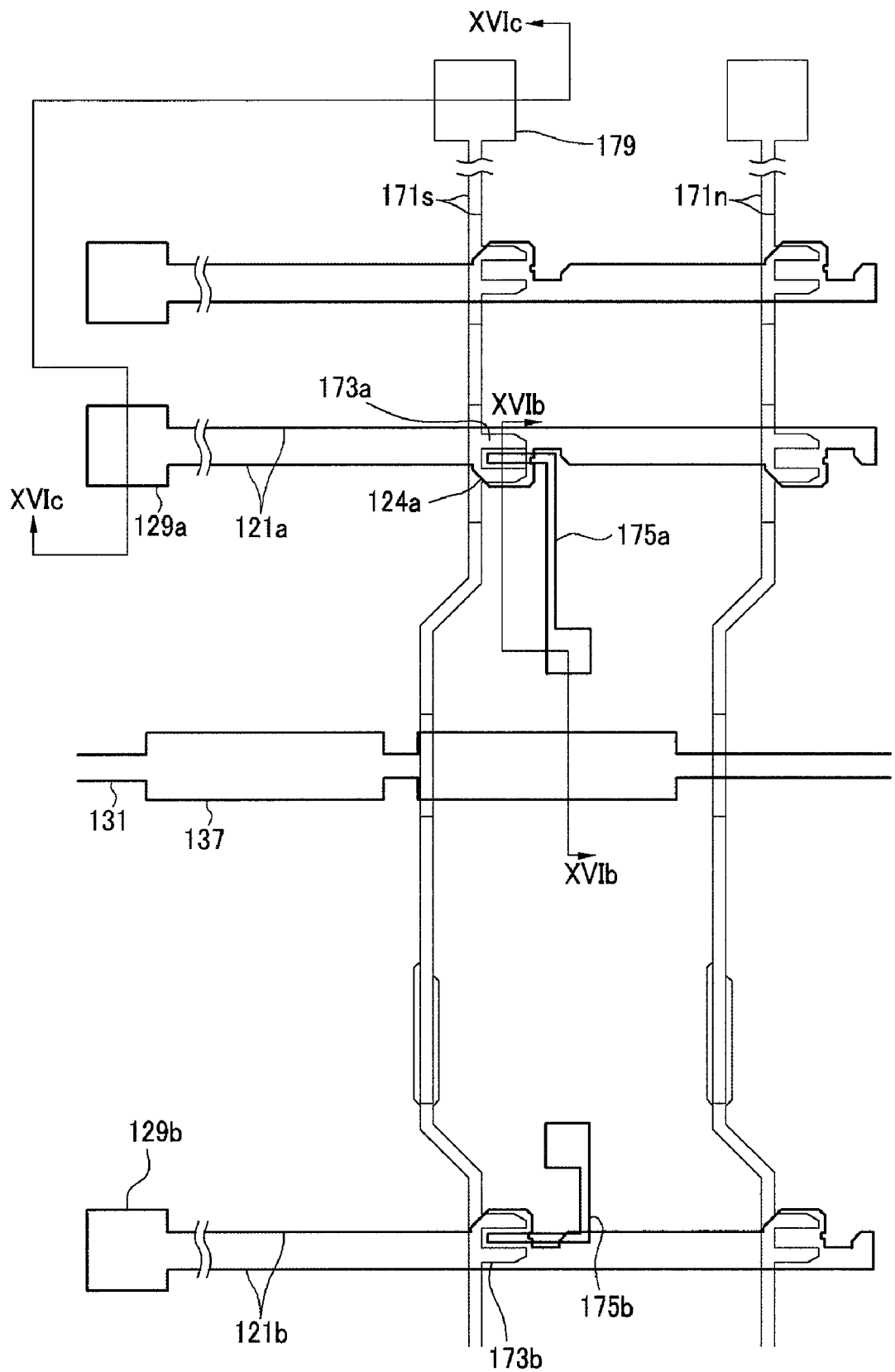
Figure 16B:
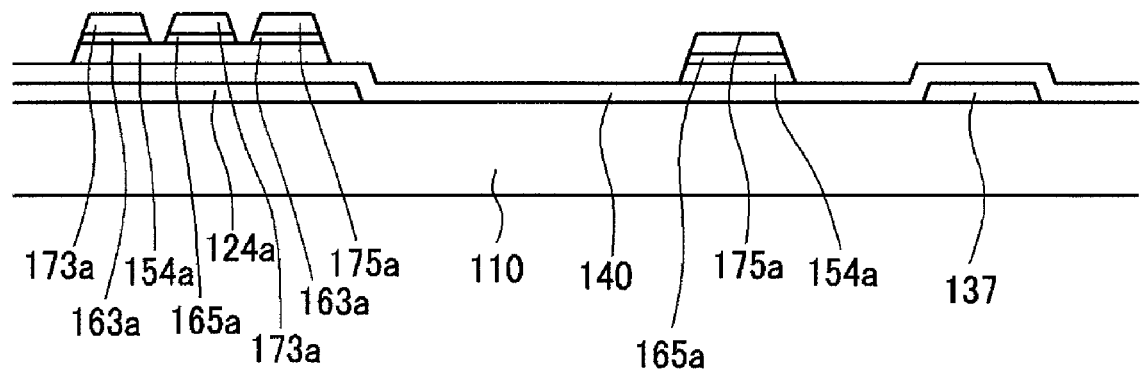
Figure 16C:
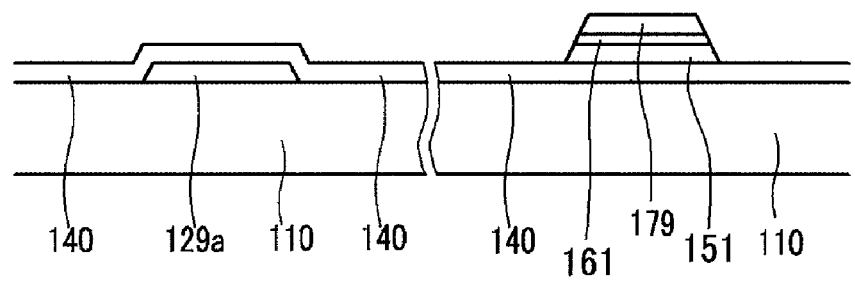

Referring to FIG. 16A, FIG. 16B, and FIG. 16C, a stack of layers is formed on the structure by sequentially depositing the gate dielectric layer 140, an intrinsic amorphous silicon layer (for the semiconductor strips 151), a doped amorphous silicon layer (for the ohmic contact strips 161s and 161n, first ohmic contact islands 165a and the second ohmic contact islands), and a metal film (the metal film is sputtered to form a data line layer). Subsequently, these layers are patterned using a single photolithography step to form the straight intrinsic semiconductor strips 151 including the straight impurity semiconductors (not shown) and projections 154, and simultaneously form a plurality of drain electrodes 175a and 175b and a plurality of data lines 171s and 171n including source electrodes 173a and 173b and their ends 179. The photoresist layer used in the photolithography step has a varying thickness. More particularly, the photoresist is thicker in the "first regions" than the "second regions". The first regions are the regions of the data lines 171, the drain electrodes 175a, 175b, and the source regions 173a, 173b, and the second regions are the regions occupied by the semiconductor strips 151 (including the projections 154a, 154b containing the channel regions of the thin film transistors). The metal layer and the amorphous silicon layers are then etched to define the semiconductor strips 151. This etch stops on the gate dielectric layer 140. The photoresist is then etched to remove the thinner photoresist portions (in the second regions) but not the thicker portions. Then the metal layer and the doped amorphous silicon layer are etched to define the metal data lines 171 and the doped silicon features including the drain regions 175a, 175b, the source regions 173a, 173b, the ohmic contact strips 161s and 161n, first ohmic contact islands 165a and the second ohmic contact islands. The doped amorphous silicon etch stops on the intrinsic amorphous silicon 151. The photoresist is then removed.

There are a number of methods to provide different photoresist thickness in these regions. In one method, the optical mask includes translucent areas corresponding to the second regions in addition to clear and opaque areas. As a result, when the photoresist has been developed, the photoresist is thinner in the second regions. In some embodiments, the photoresist is half as thick in the second regions as in the first regions. In other embodiments, the optical mask areas corresponding to the second regions are clear areas with opaque slit patterns or opaque lattice patterns to reduce the light transmittance in these areas. The light transmittance is halved in some embodiments. When a slit pattern is used, the width of the slits or gaps between the slits is preferably smaller than the resolution of the light exposer used in the photolithography step.

Another possible method uses reflowable photoresist. The reflowable photoresist is patterned using a conventional optical mask with clear and opaque areas, and then reflowed to form thin regions when flowing down from adjacent thick regions.

These methods simplify the manufacturing process by reducing the number of the photolithography steps.

Figure 17A:
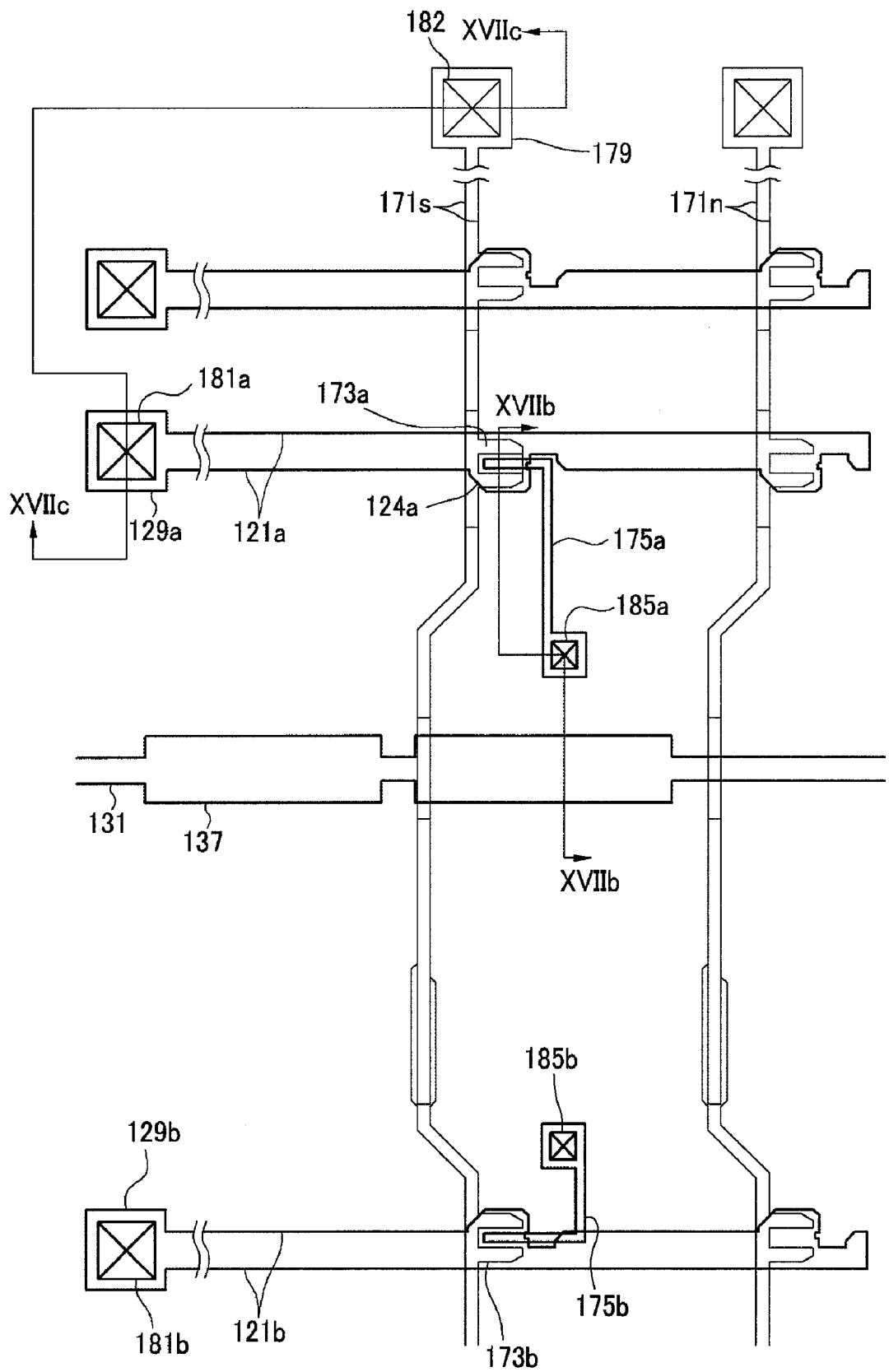
Figure 17B:
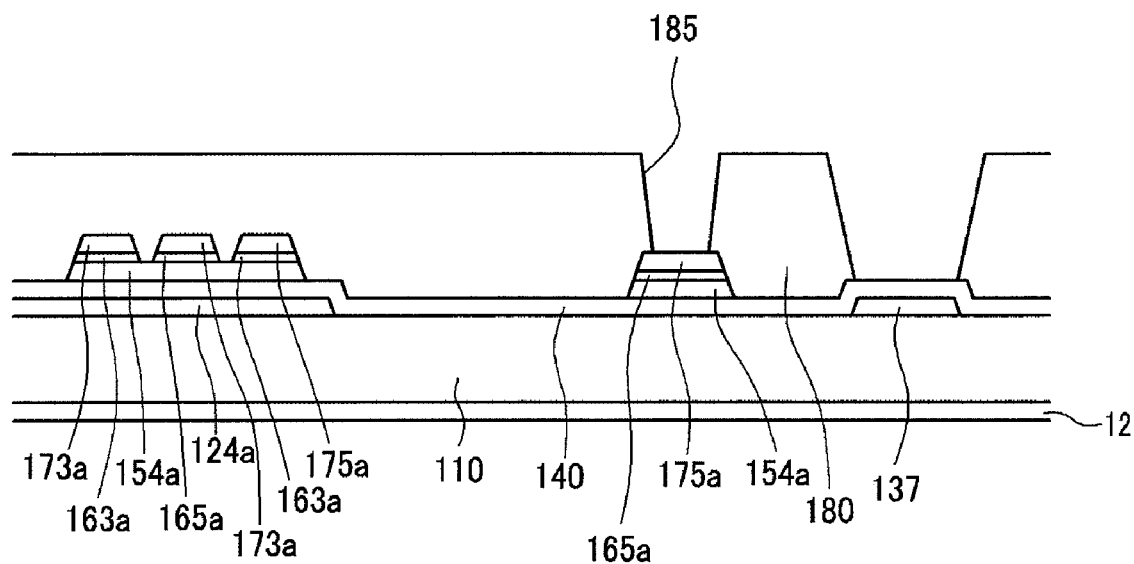
Figure 17C:
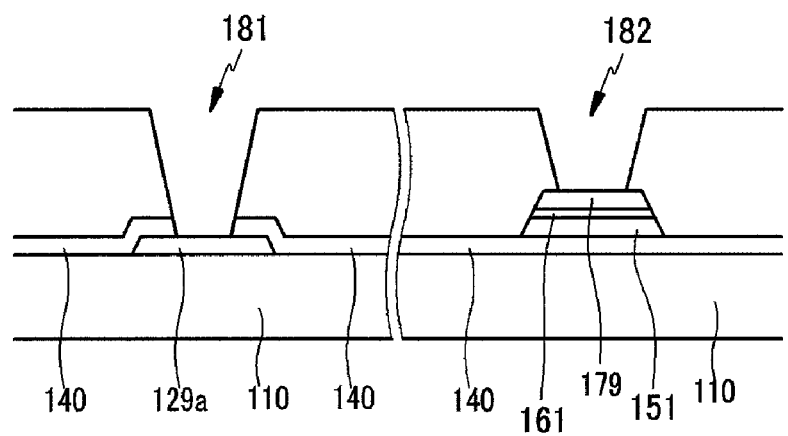
Figure 18A:
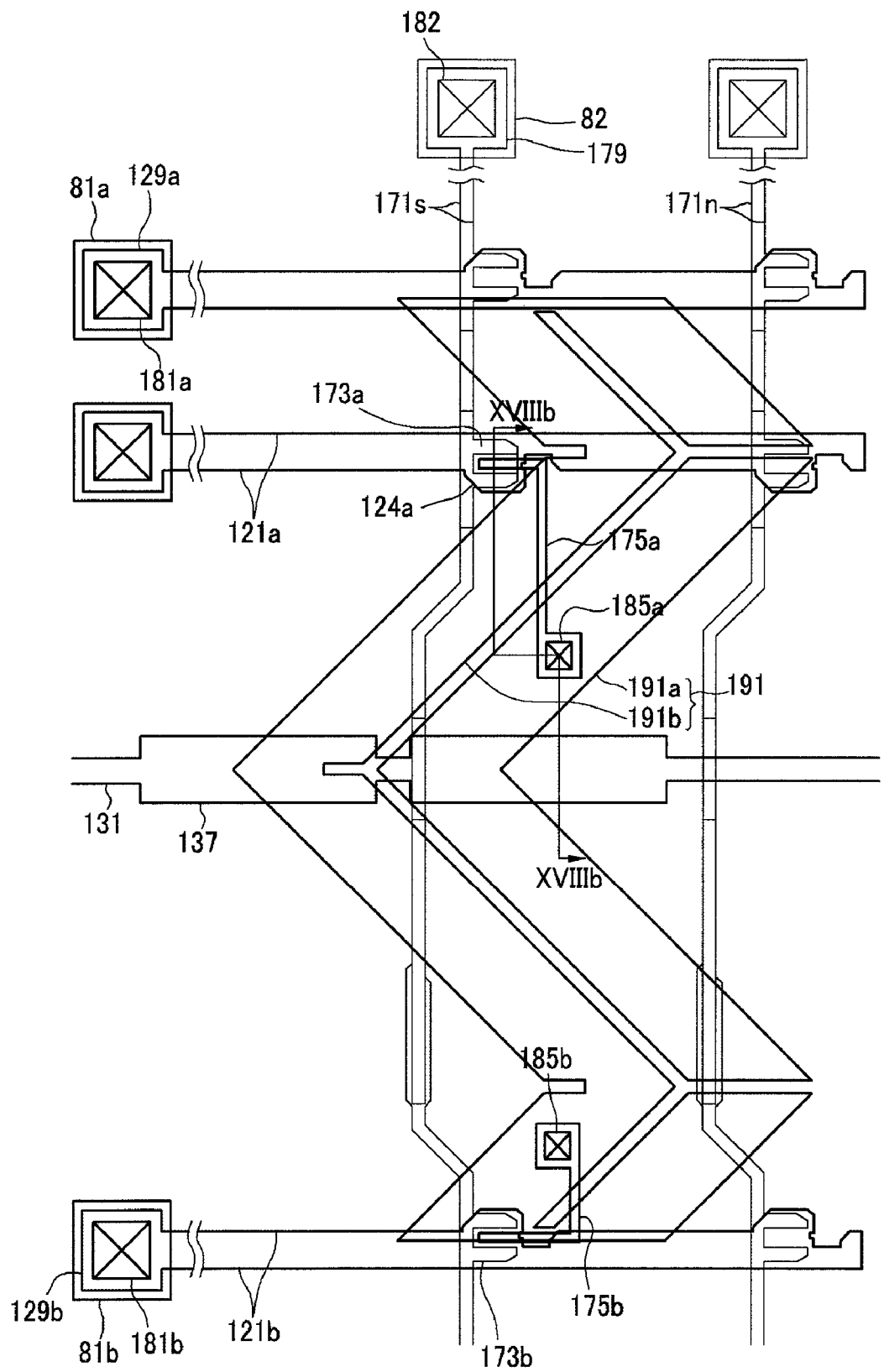
Figure 18B:
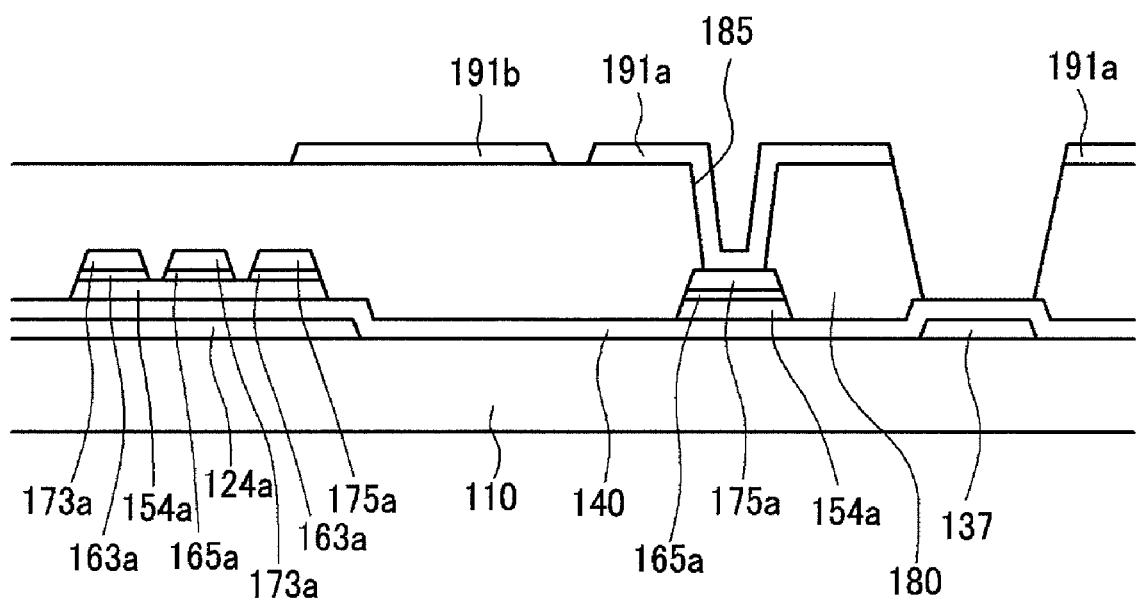

Next, referring to FIG. 17A to FIG. 17C, a passivation layer 180 is formed by depositing an inorganic insulator or a photosensitive organic insulator using a chemical vapor deposition process. Subsequently, contact holes 181, 182, 185a, and 185b are formed by etching the passivation layer 180 and the gate dielectric layer 140.

Finally, referring to FIGS. 4 to 8, an ITO or IZO film is sputtered and patterned photolithographically to form the pixel electrodes 191 and the contact liners 81 and 82. In addition, alignment layers 11 and 12 are formed on the ITO or IZO film.

Figure 6:
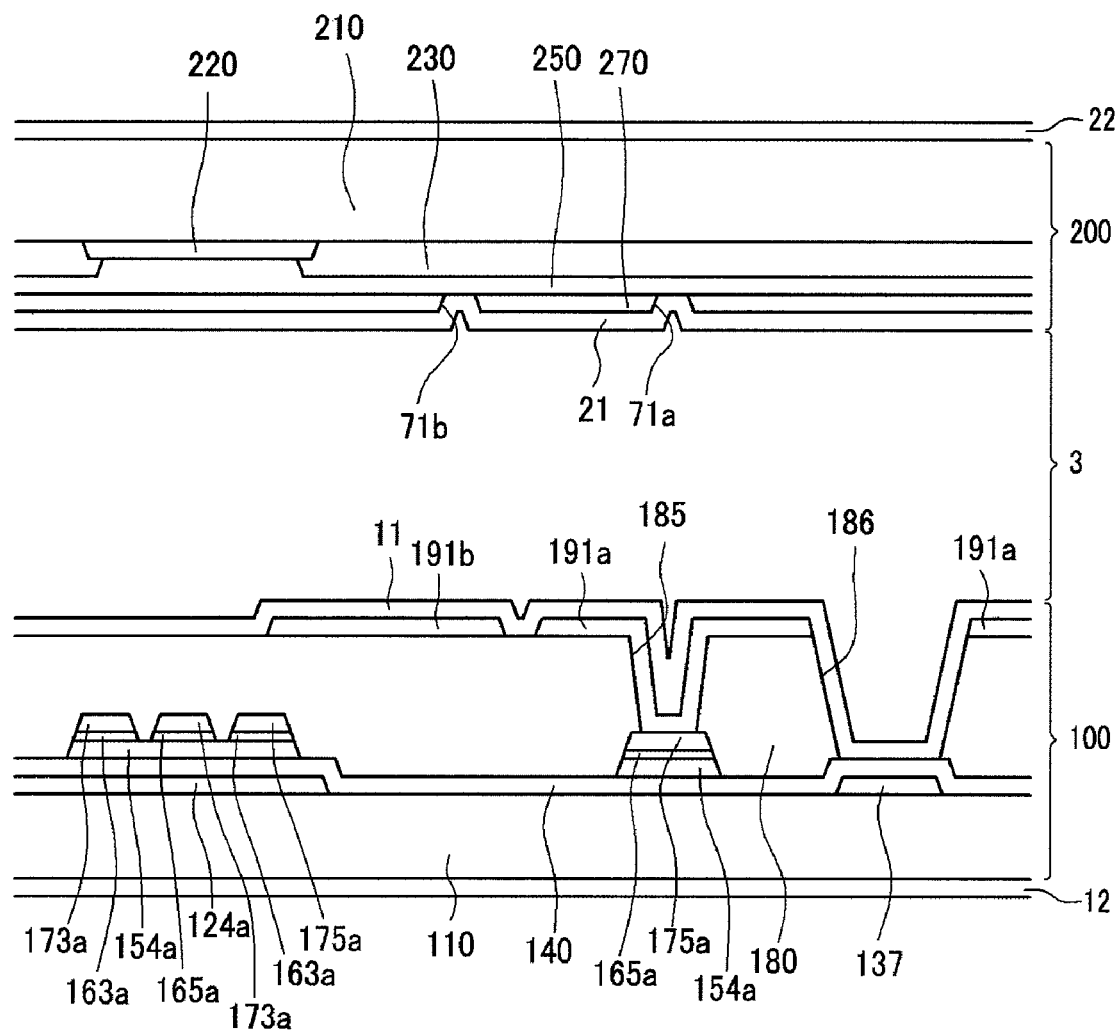
FIG. 6, FIG. 7, and FIG. 8 are cross-sectional views of the liquid crystal panel assembly taken along the lines VI-VI, VII-VII, and VIII-VIII of FIG. 4, respectively.

An exemplary embodiment of a method for manufacturing the common electrode panel 200 in the liquid crystal display shown in FIG. 4 and FIG. 6 will now be described in detail with reference to FIGS. 19A to 19D.

Figure 19A:
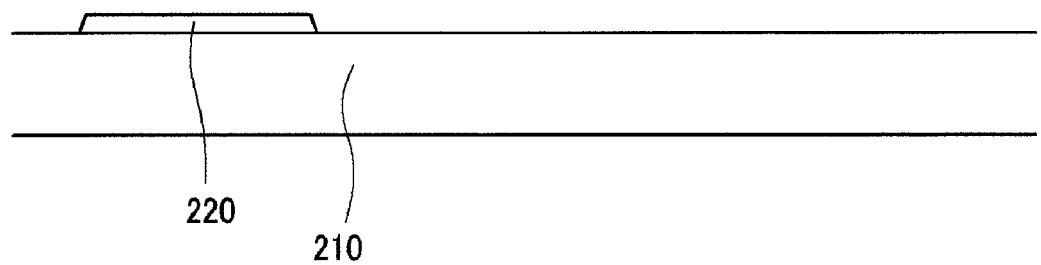
FIGS. 19A to 19D are cross-sectional views showing a common electrode panel of the liquid crystal display of FIG. 4 at different stages of fabrication.

Referring to FIG. 19A, a material having good light blocking characteristics is deposited on substrate 210 and patterned photolithographically to form the light blocking member 220.

Figure 19B:
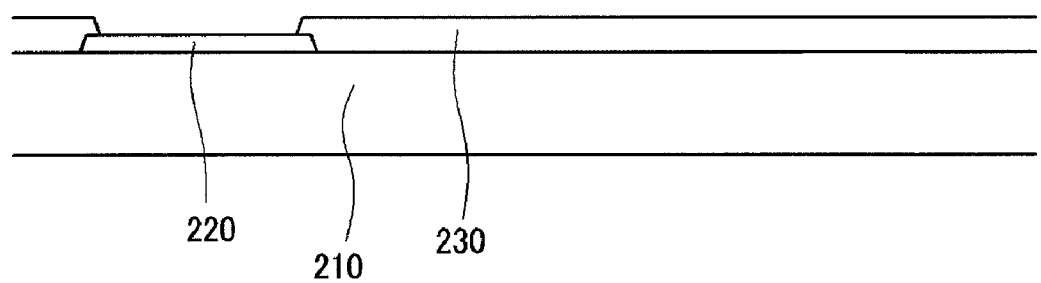

Then a photosensitive composition is formed over the flexible substrate 210 to provide the color filters 230 of three different colors, as shown in FIG. 19B.

Figure 19C:
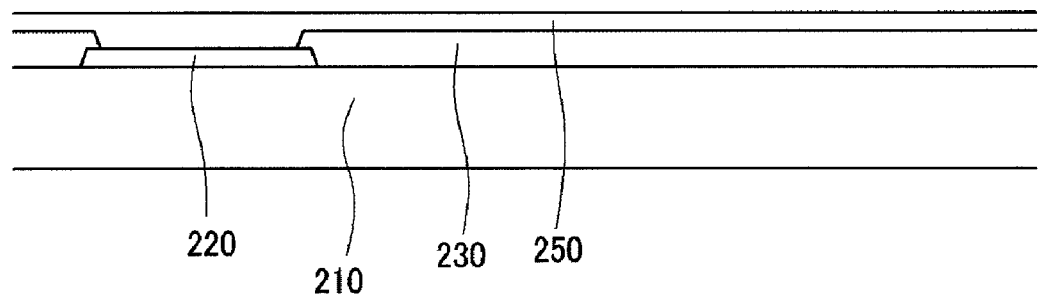
Figure 19D:
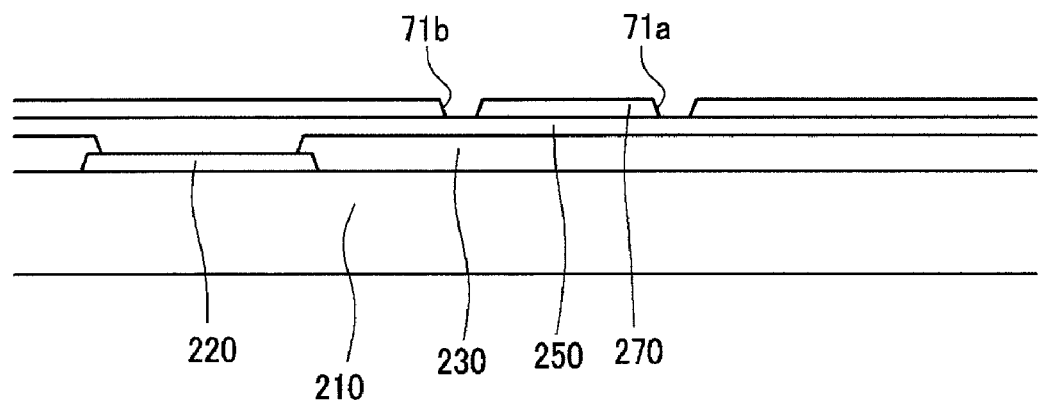

Subsequently, the overcoat 250 is formed over the color filters 230, as shown in FIG. 19C, and then the common electrode 270 is deposited on the overcoat 250, as shown in FIG. 19D.

Then the thin film transistor array panel 100 and the common electrode panel 200 are joined together. Then liquid crystal is injected into the space between the thin film transistor array panel 100 and the common electrode panel 200. Alternatively, the liquid crystal may be deposited before the joining of the thin film transistor array panel 100 to the common electrode panel 200.

A liquid crystal display according to another exemplary embodiment of the present invention will now be described in detail with reference to FIGS. 20 to 22.

Figure 20:
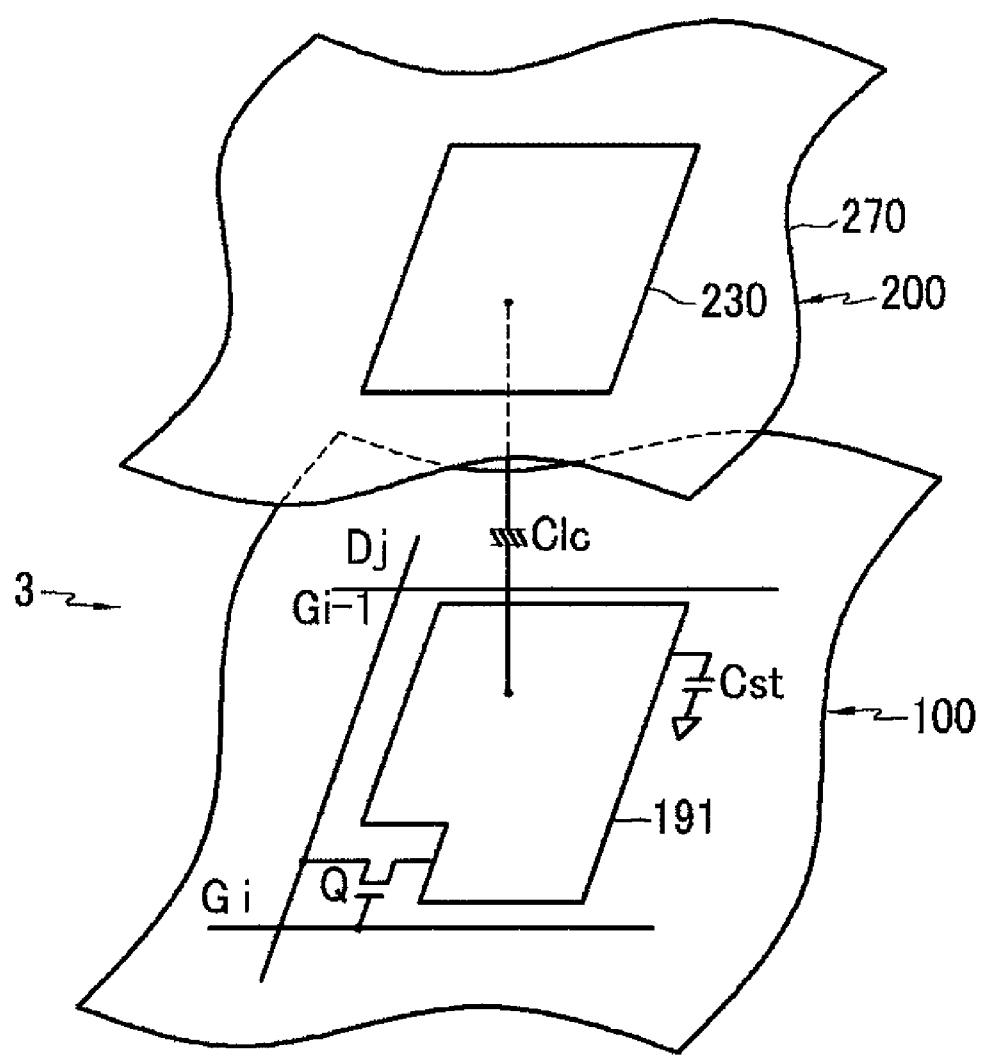
FIG. 20 is a circuit diagram for one pixel of a liquid crystal display according to another exemplary embodiment of the present invention.

FIG. 20 is a circuit diagram showing one pixel of the liquid crystal display according to this embodiment.

Referring to FIG. 20, the liquid crystal panel assembly includes lower and upper panels 100 and 200 facing each other and a liquid crystal layer 3 interposed between the lower and upper panels 100 and 200. Signal lines are provided in the lower panel 100. The signal lines include a plurality of gate lines Gi, a plurality of data lines Dj, and a plurality of storage electrode lines (not shown), and each pixel includes a switching element Q, a liquid crystal capacitor Clc connected to the switching element Q, and a storage capacitor Cst.

Unlike the liquid crystal display of FIG. 2, the pixel electrodes 191 of FIG. 20 do not have separate subpixel electrodes, but each pixel electrode is an integral structure.

The operation of the liquid crystal display of FIG. 20 is substantially identical to the operation of the previous exemplary embodiment, and therefore the detailed description of the operation of the liquid crystal display of FIG. 20 will be omitted.

An example of the liquid crystal panel assembly shown in FIG. 20 will now be described in detail with reference to FIG. 21 and FIG. 22.

Figure 21:
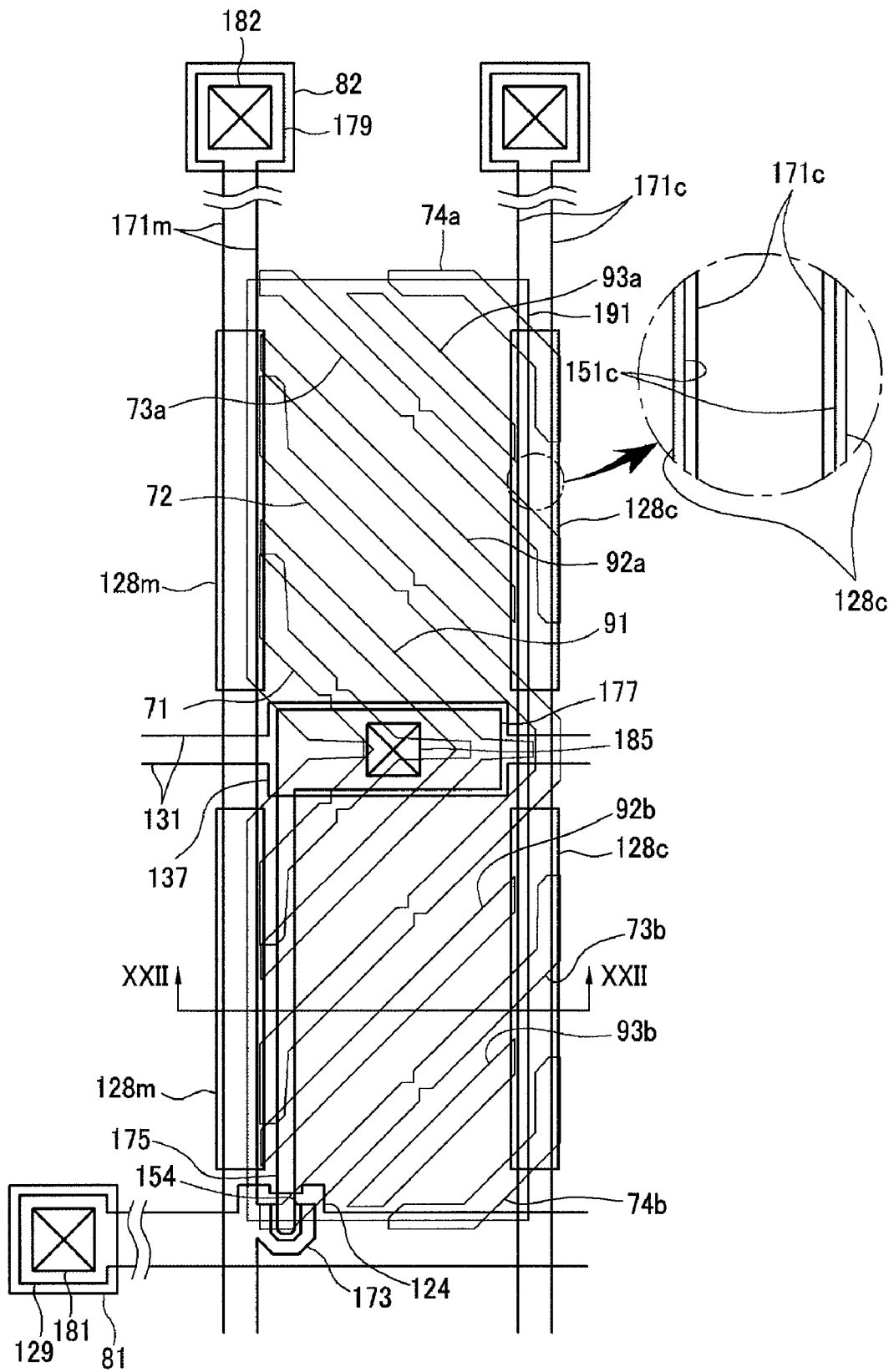
FIG. 21 is a layout view of a liquid crystal display according to an exemplary embodiment of the present invention.
Figure 22:
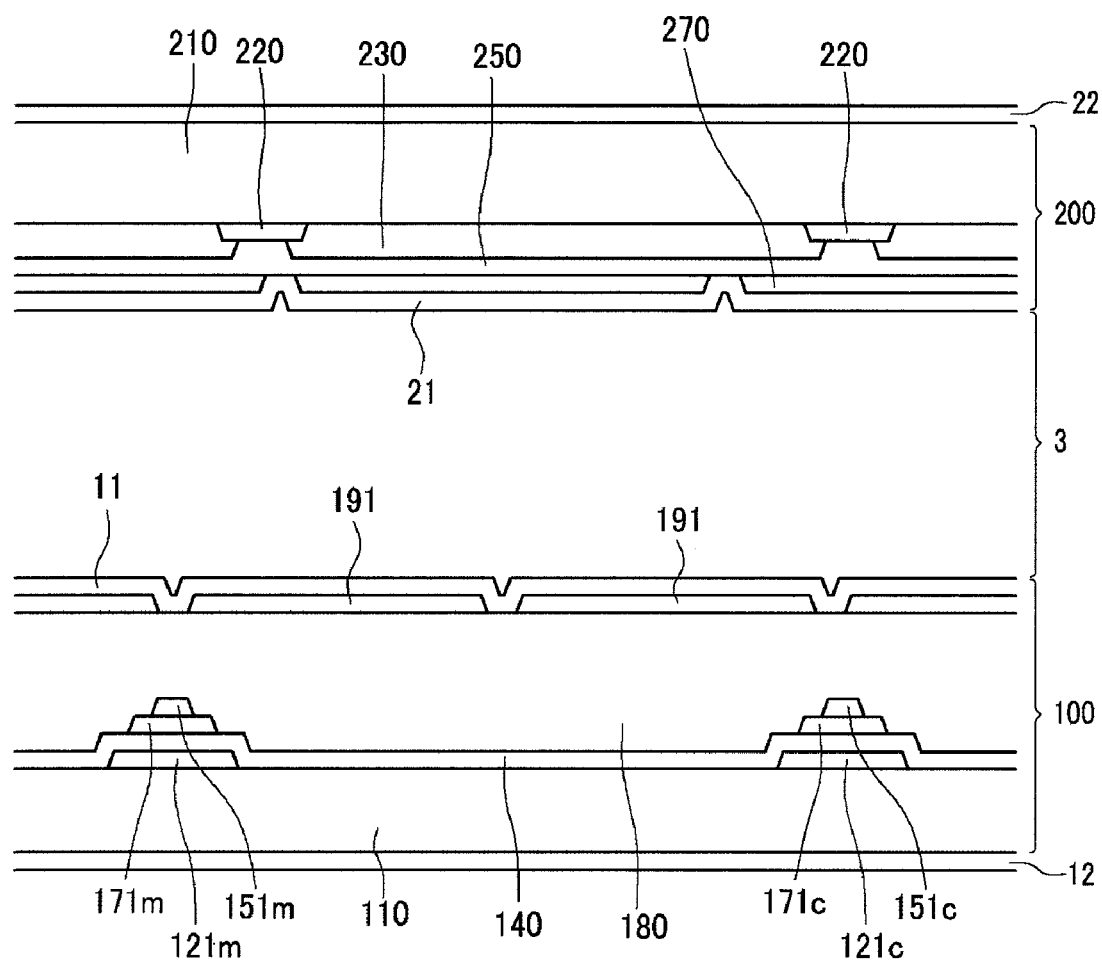
FIG. 22 is a cross-sectional view of the liquid crystal panel assembly taken along the line XXII-XXII in FIG. 21.

FIG. 21 is a layout view of the liquid crystal panel assembly, and FIG. 22 is a cross-sectional view taken along the line XXII-XXII in FIG. 21.

Referring to FIG. 21 and FIG. 22, the liquid crystal panel assembly includes lower and upper panels 100 and 200 that face each other and the liquid crystal layer 3 interposed between the lower and upper panels 100 and 200.

The liquid crystal panel assembly of FIGS. 21, 22 is formed using substantially the same layers for the same or similar elements as the liquid crystal panel assembly shown in FIGS. 4 to 8.

The lower panel 100 will now be described in detail. A plurality of gate conductors including the gate lines 121 (i.e. gate lines Gi in FIG. 20), the storage electrode lines 131, and the light blocking film 120 are formed on the insulation substrate 110. Each of the gate lines 121 includes gate electrodes 124 and a widened end 129, and each of the storage electrode lines 131 includes storage electrodes 137. The light blocking film 120 includes regions 128m and 128c which are symmetric about the storage electrode line 131. A gate dielectric layer 140 is formed on the gate conductors 120, 121, and 131. Semiconductor strips 151 including projections 154 are formed on the gate dielectric layer 140, and a plurality of ohmic contacts 161 are formed on the semiconductor strips 151. Data conductors including a plurality of data lines 171 (shown as Dj in FIG. 20) and a plurality of drain electrodes 175 are formed on the ohmic contacts 161 and the gate dielectric layer 140. The data lines 171 include a plurality of source electrodes 173 and widened ends 179, and the drain electrodes 175 include widened ends 177. A passivation layer 180 is formed on the data conductors 171 and 175 and exposed regions of the semiconductor projections 154, and a plurality of contact holes 181, 182, and 185 are formed in the passivation layer 180 and the gate dielectric layer 140. A plurality of pixel electrodes 191 and a plurality of contact liners 81 and 82 are formed on the passivation layer 180. An alignment layer 11 is formed on the pixel electrodes 191, the contact liners 81 and 82, and the passivation layer 180.

The upper panel 200 will now be described in detail. A light blocking member 220, a plurality of color filters 230, an overcoat 250, a common electrode 270 and an alignment layer 21 are formed on an insulation substrate 210.

In this embodiment, the pixel electrodes 191 are not divided into sub-pixel electrodes like in the liquid crystal display shown in FIGS. 4 to 8.

Each of the pixel electrodes 191 has a roughly quadrangular shape with four chamfered oblique edges. The chamfered oblique edges form an angle of about 45° to the gate lines 121.

A plurality of cutouts 91, 92a, 92b, 93a, and 93b are formed in each pixel electrode 191 to divide the pixel electrode 191 into a plurality of regions. Each cutout 91 is almost symmetric about the corresponding storage electrode line 131, and the cutouts 92a, 93a are almost symmetric to the respective cutouts 92b, 93b about the storage electrode line 131.

Cutouts 71, 72, 73a, 73b, 74a, and 74b are formed in the common electrode 270 opposite to each pixel electrode 191. The number and the direction of the cutouts 71 to 74b may vary depending on design factors.

In the liquid crystal display according to the present exemplary embodiment, the data lines 171 are straight. Each pixel electrode 191 overlaps with two adjacent data lines 171 as shown in FIG. 21.

Unlike the liquid crystal display shown in FIG. 4, in the liquid crystal display according to the present exemplary embodiment the storage capacitors Cst are provided by overlap of the pixel electrodes 191 and widened ends 177 of the drain electrodes 175 with the storage electrode lines 131. Of note, the storage electrode lines 131 include storage electrodes 137 overlapping with the widened ends 177. The storage capacitors help maintain the liquid crystal capacitor voltages.

Other features of the liquid crystal panel assembly shown in FIGS. 4 to 8 may be incorporated into the liquid crystal panel assembly of FIGS. 19 to 22.

In some embodiments of the present invention, the image quality of the liquid crystal display is improved by providing large aperture ratio and preventing waterfall generation.

The invention is not limited to the embodiments disclosed herein, but is intended to cover various modifications and other arrangements within the scope of the appended claims.

What is claimed is:

1. A liquid crystal display comprising:
   a substrate;
   a first gate line over the substrate;
   a gate insulator over the first gate line;
   a first semiconductor pattern over the gate insulator;
   a first drain electrode and a first data line overlapping with the first semiconductor pattern;
   a pixel electrode connected to the first drain electrode and overlapping with the first data line; and
   a light blocking pattern overlapping with the first semiconductor pattern and the first data line;
   wherein the first semiconductor pattern is wider than the first data line.

2. The liquid crystal display of claim 1, wherein the light blocking pattern is made of the same material as the first gate line.

3. The liquid crystal display of claim 1, wherein the light blocking pattern includes portions of different widths.

4. The liquid crystal display of claim 1, wherein the pixel electrode comprises first and second subpixel electrodes that are separated from each other.

5. The liquid crystal display of claim 4, wherein the first and second subpixel electrodes comprise at least two parallelogrammic electrode positioners extending in respective two different directions.

6. The liquid crystal display of claim 5, wherein:
   the first subpixel electrode comprises one right-slope parallelogrammic electrode positioner and one left-slope parallelogrammic electrode positioner; and
   the second subpixel electrode comprises three right-slope parallelogrammic electrode positioners and three left-slope parallelogrammic electrode positioners.

7. The liquid crystal display of claim 4, wherein the second subpixel electrode has a larger area than the first subpixel electrode.

8. The liquid crystal display of claim 4, wherein the first subpixel electrode is at a different voltage from the second subpixel electrode.

9. The liquid crystal display of claim 4, further comprising:
   a second gate line over the substrate;
   a first thin film transistor connected to the first subpixel electrode; and
   a second thin film transistor connected to the second subpixel electrode,
   wherein the first gate line is connected to the first thin film transistor, and wherein the second gate line is connected to the second thin film transistor.

10. The liquid crystal display of claim 9, wherein the first and second thin film transistors are turned on in response to signals from the first and second gate lines, respectively, to transmit signals from the first data line.

11. The liquid crystal display of claim 1, further comprising an organic layer between the data line and the pixel electrode and between the drain electrode and the pixel electrode.

12. The liquid crystal display of claim 1, wherein the light blocking pattern is wider than the first semiconductor pattern.

13. The liquid crystal display of claim 1, further comprising:
   a second data line neighboring the first data line and overlapping with the pixel electrode; and
   a second semiconductor pattern overlapping with the second data line,
   wherein an overlap area of the pixel electrode with the first semiconductor pattern is substantially equal to an overlap area of the pixel electrode with the second semiconductor pattern.

14. The liquid crystal display of claim 13, wherein the first data line and the second data line have opposite voltage polarities.

15. The liquid crystal display of claim 1, wherein the light blocking pattern is formed on the same pattern as the first gate line.

16. A liquid crystal display comprising:
   a substrate;
   a gate line on the substrate;
   a gate insulator layer on the gate line;
   a first semiconductor pattern on the gate insulator layer;
   a first drain electrode and a first data line overlapping with the first semiconductor pattern;
   a pixel electrode connected to the first drain electrode and overlapping with the first data line, the pixel electrode comprising first and second subpixel electrodes; and
   a light blocking pattern on at least one of a first region in which the first subpixel electrode overlaps with the first data line and a second region in which the second subpixel electrode overlaps with the first data line.

17. The liquid crystal display of claim 16, wherein the light blocking pattern in the first region is wider than the light blocking pattern in the second region.

18. The liquid crystal display of claim 17, wherein the light blocking pattern in the second region is substantially as wide as the first semiconductor pattern.

19. The liquid crystal display of claim 17, wherein the light blocking pattern in the first region is wider than the first semiconductor pattern.

20. The liquid crystal display of claim 19, wherein one edge of the light blocking pattern in the first region protrudes by more than 3 .mu.m beyond the first semiconductor pattern.

21. The liquid crystal display of claim 16, further comprising:
   a second data line neighboring the first data line and overlapping with the pixel electrode; and
   a second semiconductor pattern overlapping with the second data line,
   wherein an overlap area of the pixel electrode with the first semiconductor pattern is equal to an overlap area of the pixel electrode with the second semiconductor pattern.

22. The liquid crystal display of claim 21, wherein the first data line and the second data line have opposite voltage polarities.

23. A liquid crystal display comprising:
   pixel electrodes;
   one or more first electrodes;
   liquid crystal between the pixel electrodes and the first electrodes, the liquid crystal being in a path of light from a backlighting unit;

gate lines and data lines for carrying signals to the pixel electrodes;

transistors connected between the data lines and the pixel electrodes;

a semiconductor pattern comprising channel regions for the transistors and also comprising a first layer whose conductivity depends on whether or not it is exposed to the light from the backlighting unit, the layer overlapping with the pixel electrodes; and a light blocking pattern for shielding the first layer from said light, wherein the semiconductor pattern is wider than one of the data lines.

24. The liquid crystal display of claim 23, wherein the light blocking pattern is formed on the same pattern as one of the gate lines.

* * * * *